US012403852B2

(12) United States Patent
Slade et al.

(10) Patent No.: US 12,403,852 B2
(45) Date of Patent: Sep. 2, 2025

(54) LIGHT STRIP COMMUNICATION SYSTEM

(71) Applicant: Grote Industries, Inc., Madison, IN (US)

(72) Inventors: Adam Slade, Madison, IN (US); Sankalp Pampattiwar, Madison, IN (US); Cesar Perez-Bolivar, Madison, IN (US)

(73) Assignee: Grote Industries, Inc., Madison, IN (US)

( * ) Notice: Subject to any disclaimer, the term of this patent is extended or adjusted under 35 U.S.C. 154(b) by 444 days.

(21) Appl. No.: 17/939,279

(22) Filed: Sep. 7, 2022

(65) Prior Publication Data

US 2023/0102039 A1    Mar. 30, 2023

Related U.S. Application Data

(60) Provisional application No. 63/248,568, filed on Sep. 27, 2021.

(51) Int. Cl.
*B60Q 1/00* (2006.01)
*B60R 16/023* (2006.01)
*G01R 15/14* (2006.01)
*G01R 17/02* (2006.01)

(52) U.S. Cl.
CPC ........ *B60R 16/0232* (2013.01); *B60Q 1/0088* (2013.01); *G01R 15/146* (2013.01); *G01R 17/02* (2013.01)

(58) Field of Classification Search
CPC .............. B60R 16/0232; B60Q 1/0088; G01R 15/146; G01R 17/02
See application file for complete search history.

(56) References Cited

U.S. PATENT DOCUMENTS

| 3,891,279 | A | * | 6/1975 | Frait | G01R 31/28 340/687 |
| 4,041,470 | A | * | 8/1977 | Slane | B61L 15/0036 340/505 |
| 4,897,642 | A | * | 1/1990 | DiLullo | G01S 5/0009 701/1 |

(Continued)

FOREIGN PATENT DOCUMENTS

| EP | 1839928 A2 | 10/2007 |
| EP | 2377723 A1 | 10/2011 |

(Continued)

*Primary Examiner* — Quang Pham
(74) *Attorney, Agent, or Firm* — Woodard Emhardt Henry Reeves & Wagner LLP

(57) ABSTRACT

A communication system that utilizes a light strip to carry data using the power and ground connections of the light strip. When used in the context of a truck and trailer, the system may include a sensor node configured to obtain status information about trailer components, and a data hub for collecting the information. The data about the trailer components may be transferred from the sensor node to the data hub using the power and/or ground connections of the light strip. The sensor node may communicate using the light strip by changing the current level of the light strip power connection, and these changes in the current level may be used by the data hub as a signal by which the data may be received.

41 Claims, 15 Drawing Sheets

(56) References Cited

U.S. PATENT DOCUMENTS

| | | | | |
|---|---|---|---|---|
| 5,025,253 A * | 6/1991 | DiLullo | G07C 5/008 | 340/10.5 |
| 5,142,278 A * | 8/1992 | Moallemi | B61L 15/0036 | 340/436 |
| 5,397,924 A * | 3/1995 | Gee | B60D 1/62 | 340/3.1 |
| 5,406,248 A * | 4/1995 | Le Van Suu | H04L 12/4135 | 340/12.32 |
| 5,442,810 A * | 8/1995 | Jenquin | B60T 17/04 | 455/66.1 |
| 5,488,352 A * | 1/1996 | Jasper | H01R 13/6633 | 280/423.1 |
| 5,677,667 A * | 10/1997 | Lesesky | B60T 17/043 | 439/35 |
| 5,739,592 A * | 4/1998 | Rigsby | B60D 1/62 | 701/32.7 |
| 5,845,990 A * | 12/1998 | Hymer | B60Q 1/0035 | 362/540 |
| 5,848,837 A * | 12/1998 | Gustafson | F21V 31/04 | 362/240 |
| 6,039,410 A * | 3/2000 | Robertson | B60T 7/20 | 188/3 R |
| 6,064,299 A * | 5/2000 | Lesesky | B60R 16/0315 | 398/1 |
| 6,111,524 A * | 8/2000 | Lesesky | G08G 1/017 | 398/1 |
| 6,127,939 A * | 10/2000 | Lesesky | B60T 8/1708 | 307/10.1 |
| 6,222,443 B1 * | 4/2001 | Beeson | B60D 1/62 | 340/539.1 |
| 6,254,201 B1 * | 7/2001 | Lesesky | B60T 8/1708 | 303/122.02 |
| 6,535,113 B1 * | 3/2003 | Gravolin | B60Q 11/007 | 340/687 |
| 6,744,352 B2 * | 6/2004 | Lesesky | B60R 16/0315 | 340/933 |
| 6,799,814 B2 * | 10/2004 | Lesesky | B60T 8/323 | 340/3.1 |
| 6,943,677 B2 * | 9/2005 | Boyer | B60Q 1/444 | 340/463 |
| 7,015,800 B2 * | 3/2006 | Lesesky | G08G 1/017 | 340/933 |
| 7,497,529 B2 * | 3/2009 | Lesesky | B60T 7/20 | 340/3.1 |
| 7,744,375 B2 * | 6/2010 | Huang | H01R 13/6205 | 439/35 |
| 8,082,086 B2 * | 12/2011 | Heise | B60T 8/1708 | 280/422 |
| 8,276,996 B2 * | 10/2012 | Lesesky | B60T 13/662 | 340/3.1 |
| 8,319,433 B2 * | 11/2012 | Lin | B60Q 3/47 | 315/312 |
| 8,482,397 B1 * | 7/2013 | Tajiri | B60Q 1/44 | 701/79 |
| 8,536,985 B1 * | 9/2013 | Wedding | B60R 16/0315 | 370/488 |
| 9,102,267 B2 * | 8/2015 | Kulkarni | H05B 45/10 | |
| 9,243,759 B2 * | 1/2016 | Lin | F21K 9/65 | |
| 9,253,845 B2 * | 2/2016 | Davies | H05B 45/18 | |
| 9,386,658 B2 * | 7/2016 | Preta | G08B 21/182 | |
| 9,434,308 B2 * | 9/2016 | Bean | G01R 31/007 | |
| 9,481,346 B2 * | 11/2016 | Morselli | B60T 8/248 | |
| 9,501,926 B1 * | 11/2016 | Meninno | G08C 19/22 | |
| 10,502,772 B2 * | 12/2019 | Slade | H05B 45/58 | |
| 10,601,188 B2 * | 3/2020 | Ireland | F21V 23/02 | |
| 10,854,023 B1 * | 12/2020 | Trinh | H04L 27/2627 | |
| 10,926,594 B2 * | 2/2021 | Slade | B62D 63/08 | |
| 10,998,935 B2 * | 5/2021 | Liu | B64D 45/00 | |
| 11,135,967 B1 * | 10/2021 | Schowengerdt | F21V 21/26 | |
| 11,155,207 B2 * | 10/2021 | Yan | H04N 7/181 | |
| 11,235,743 B2 * | 2/2022 | Higuchi | H04W 4/44 | |
| 11,496,816 B2 * | 11/2022 | Troutman | H04L 67/12 | |
| 11,536,762 B2 * | 12/2022 | Pampattiwar | H04L 12/40013 | |
| 11,665,016 B2 * | 5/2023 | Haslam | G01C 21/16 | 701/36 |
| 11,697,314 B2 * | 7/2023 | Slade | B60R 16/0239 | 439/35 |
| 11,758,379 B2 * | 9/2023 | Lansford | B60D 1/62 | 455/41.2 |
| 11,770,505 B1 * | 9/2023 | Nguyen | H04N 7/18 | 348/148 |
| 11,865,884 B2 * | 1/2024 | Pampattiwar | B60D 1/64 | |
| 12,184,013 B2 * | 12/2024 | Kageta | H04N 23/57 | |
| 2002/0105227 A1 * | 8/2002 | Nerone | H02J 1/08 | 307/10.1 |
| 2003/0003777 A1 * | 1/2003 | Lesesky | B60R 16/0315 | 439/34 |
| 2003/0141965 A1 * | 7/2003 | Gunderson | B60Q 9/008 | 348/148 |
| 2005/0068765 A1 * | 3/2005 | Ertze Encinas | F21V 29/75 | 362/183 |
| 2005/0258947 A1 * | 11/2005 | Kunianski | B60D 1/62 | 340/471 |
| 2006/0049693 A1 * | 3/2006 | Abraham | H04L 27/18 | 455/99 |
| 2006/0071549 A1 * | 4/2006 | Chesnut | B60T 7/16 | 303/3 |
| 2006/0187078 A1 * | 8/2006 | Bell | B60Q 1/305 | 340/815.4 |
| 2006/0267746 A1 * | 11/2006 | Kinsey | B60Q 11/00 | 340/431 |
| 2007/0063831 A1 * | 3/2007 | Perkins | B60Q 1/445 | 340/479 |
| 2007/0241868 A1 * | 10/2007 | Fackrell | B60T 7/042 | 340/533 |
| 2009/0177349 A1 * | 7/2009 | Lesesky | B60T 13/662 | 303/123 |
| 2011/0090072 A1 * | 4/2011 | Haldeman | B60Q 7/02 | 340/431 |
| 2011/0114721 A1 * | 5/2011 | Thompson | G06Q 10/08 | 235/376 |
| 2011/0281522 A1 * | 11/2011 | Suda | G06Q 10/0833 | 455/41.2 |
| 2012/0200434 A1 * | 8/2012 | Roberts, Sr. | G06F 17/00 | 340/994 |
| 2013/0278427 A1 * | 10/2013 | Setton | G08B 21/12 | 340/584 |
| 2014/0129061 A1 * | 5/2014 | Cooper | H04L 63/00 | 701/19 |
| 2015/0137961 A1 * | 5/2015 | Bean | G01R 31/007 | 340/431 |
| 2015/0200712 A1 * | 7/2015 | Cooper | H04L 12/40169 | 375/257 |
| 2015/0217790 A1 * | 8/2015 | Golden | B60T 17/228 | 701/19 |
| 2015/0349977 A1 * | 12/2015 | Risse | H04L 12/6418 | 375/257 |
| 2016/0023588 A1 * | 1/2016 | Peterson | B60Q 1/34 | 315/77 |
| 2016/0105024 A1 * | 4/2016 | Guillemin | H02J 3/26 | 307/39 |
| 2016/0159173 A1 * | 6/2016 | Schneider | G08B 19/00 | 701/400 |
| 2016/0297361 A1 * | 10/2016 | Drazan | B60R 1/26 | |
| 2017/0089697 A1 * | 3/2017 | Shepard | G01B 21/22 | |
| 2017/0171952 A1 * | 6/2017 | Troutman | B60Q 11/005 | |
| 2017/0240125 A1 * | 8/2017 | Weigert | B60R 16/023 | |
| 2018/0059161 A1 * | 3/2018 | Slade | G01R 31/44 | |
| 2019/0016247 A1 * | 1/2019 | Sassoon | B60Q 1/04 | |
| 2019/0241126 A1 * | 8/2019 | Murad | B60R 1/12 | |
| 2019/0248346 A1 * | 8/2019 | Wulf | B60T 7/20 | |
| 2019/0299859 A1 * | 10/2019 | Lu | H04N 23/698 | |
| 2020/0064180 A1 * | 2/2020 | Gonçalves | G07C 5/085 | |
| 2020/0118361 A1 * | 4/2020 | Zula | G01M 17/007 | |
| 2020/0174055 A1 * | 6/2020 | Pampattiwar | H04W 24/02 | |
| 2020/0189408 A1 * | 6/2020 | Ko | B60L 53/16 | |
| 2020/0338941 A1 * | 10/2020 | Slade | B60R 16/0239 | |
| 2021/0318361 A1 * | 10/2021 | Knierim | G01R 19/0092 | |
| 2021/0347218 A1 * | 11/2021 | Huett | B60D 1/64 | |

(56) References Cited

U.S. PATENT DOCUMENTS

| | | | | |
|---|---|---|---|---|
| 2021/0347293 | A1* | 11/2021 | Zeng | F21S 43/14 |
| 2021/0394570 | A1* | 12/2021 | Wahba | B60D 1/245 |
| 2023/0114741 | A1* | 4/2023 | Guglielmo | B60L 1/02 |
| | | | | 320/107 |
| 2023/0140569 | A1* | 5/2023 | Foster | B60W 60/0017 |
| | | | | 701/400 |
| 2023/0219501 | A1* | 7/2023 | Reid | H04N 7/183 |
| | | | | 348/148 |

FOREIGN PATENT DOCUMENTS

| | | |
|---|---|---|
| WO | WO 1996/041428 | 12/1996 |
| WO | WO 2005/119122 | 12/2005 |
| WO | WO 2016/150828 | 9/2016 |

\* cited by examiner

LIGHT STRIP COMMUNICATION SYSTEM

CROSS-REFERENCE TO RELATED APPLICATION

This application claims the benefit of U.S. Provisional Application No. 63/248,568 filed Sep. 27, 2021, which is hereby incorporated by reference.

BACKGROUND

The present disclosure relates generally to a communication system that uses a power connection in a strip of lights as a data bus for transmitting data. Light strips are commonly used where distributed light is desired, such as along a narrow corridor. In truck trailers, for example, light strips are especially useful for evenly illuminating a box or refrigerated trailer. Light strips typically use common circuits for ground and power, with one or more lamps or light engines electrically connected to these common circuits, typically in parallel.

SUMMARY

Disclosed is a communication system that utilizes the power and ground circuits of a light strip as a data bus by which data may be transferred, preferably without affecting the overall performance of the light strip. The system may be useful wherever strip lighting is available, such as in the case of strip lighting mounted to a truck trailer. The system may include a sensor node electrically connected to a trailer component. The sensor node may be electrically connected to a power circuit and a ground circuit, configured to receive status information about the trailer component, and configured to use the power circuit or the ground circuit to broadcast trailer component data that corresponds to the status of the trailer component. The system may also include a light strip having one or more lamps electrically connected to the power circuit and the ground circuit, and a data hub optionally electrically connected to the power circuit and the ground circuit. The data hub is optionally configured to capture the trailer component data broadcasted by the sensor node on the power or ground circuits and may provide corresponding data hub output. This data hub output may then be consumed by another system, or displayed to the operator of the truck in the form of status information, warning messages, and the like.

In another aspect, the system may include a sensor electrically connected to the trailer component and the sensor node. The sensor may be responsive to the trailer component and may be configured to generate the status information about the trailer component for the sensor node. In another aspect the status information about the trailer component may include a fault indicator indicating whether or not the trailer component has failed. In another aspect, the system may include a fault detection circuit optionally arranged and configured to determine when the trailer component has failed.

In another aspect, the status information may include a temperature indicator indicating a temperature reading obtained by the trailer component. In another aspect, the status information optionally includes a door open indicator indicating whether or not a door of the trailer is open. In another aspect, the status information optionally includes a pressure indicator indicating a pressure reading obtained by the trailer component. In another aspect, the status information optionally includes a status code indicating an operational state of the trailer component. In another aspect, the status information optionally includes operational parameter values indicating operating parameters of the trailer component.

In another aspect, the sensor may be separate and distinct from the sensor node. In another aspect, the sensor may be mounted in a receptacle of the trailer component. In another aspect, the sensor is optionally included with the sensor node.

In another aspect the sensor node may include a control circuit optionally responsive to the trailer component input, and a switching device that may be responsive to the control circuit. The switching device may be configured to selectively electrically connect and disconnect a resistor to the power circuit in response to the control circuit. In another aspect, the current in the power circuit may be increased when the shunt resistor is connected to power, and optionally decreased when the shunt resistor is disconnected from the power circuit.

In another aspect, the data hub may be configured to measure changes in current flowing through the power circuit and to optionally generate the data hub output accordingly. In another aspect the data hub may include a control circuit responsive to changes in the current passing through a sense resistor, and the sense resistor may be electrically connected in series upstream in the power circuit from the light strip.

In another aspect, the trailer component data is optionally defined by time varying changes in current of the power circuit, the current may vary between a first level and a second level higher than the first level. In another aspect, the light strip may define a minimum current level required to activate the lamps of the light strip. In another aspect, the second level may be less than the minimum current level. In another aspect, the first level may be greater than the minimum current level. In another aspect, the light strip optionally defines a maximum current level for the lamps of the light strip, and the second level may be less than the maximum level for the lamps. In another aspect, the first and second levels may be less than the minimum current level which allows the light strip to be used as a data bus when the lamps are inactive. In another aspect, the first level may be less than the minimum current level, and wherein the second level may be greater than the minimum current level. In another aspect, the data signal may define a frequency of greater than 100 Hz, or greater than 1000 Hz, or greater than 10,000 Hz. Higher frequency may help to reduce or eliminate flickering which may become more noticeable at lower frequencies when the current levels in the light strip oscillate between the first and second levels.

In another aspect, the sensor node may be electrically connected in parallel with the lamps of the light strip. In another aspect, the sensor node may include a switching device optionally configured to selectively electrically connect and disconnect a shunt resistor to the power circuit in response to the information about the trailer component. The switching device may be electrically connected in series with a shunt resister, and the combination of the switching device and the shunt resistor may be electrically connected in parallel with the light strip.

In another aspect, the data hub may include a sense resistor that may be electrically connected in the power circuit in series with the light strip, and optionally a current sensing circuit electrically connected in parallel with the light strip and the sense resistor and having at least one output terminal, wherein the data hub output is optionally accessible via the output terminal. In another aspect, the data hub optionally includes a control circuit that may be programmed and configured to derive the data hub output from the trailer component data.

In another aspect, the sensor node may be operable to encode the status information as trailer component data, and wherein the control circuit may be operable to decode the trailer component data and to optionally include the status information in the data hub output from the trailer component data. In another aspect, the sensor node may be arranged and configured to broadcast the trailer component data as a time varying signal, and wherein the data hub output optionally matches the time varying signal.

In another aspect, the lamps of the light strip may include one or more LEDs. In another aspect, the trailer component optionally includes one or more LEDs. In another aspect, the trailer component may be any one of a vehicle stop-tail-turn lamp, a vehicle turn signal lamp, a vehicle brake lamp, a vehicle tail lamp, a vehicle running lamp, a vehicle anti-lock brake, a vehicle interior illumination lamp, or a vehicle reverse lamp. In another aspect, the trailer component may be any one of an antilock brake system controller, a pressure sensor, a temperature sensor, a door sensor, a cargo sensor, a cargo a length sensor, a liquid level sensor, or a refrigerant level sensor.

In another aspect, the light strip may be mounted to a truck trailer coupled to a truck tractor that optionally includes at least one trailer monitoring user interface, and the trailer monitoring user interface may be responsive to the data hub and is optionally configured to provide information about the trailer component in response to the data hub output. In another aspect, the data hub output may be electrically connected to the trailer monitoring user interface by a cable. In another aspect, the data hub may be mounted in a common housing with the trailer monitoring user interface. In another aspect, the sensor node and data hub may be mounted to the trailer. In another aspect, the sensor node may be mounted to the trailer and the data hub is optionally mounted to the truck.

In another aspect, the system optionally includes a communication module optionally configured to maintain a communication link with a remote trailer monitoring system, wherein the communication module may be electrically connected to the data hub output, and wherein the communication module may be configured to relay the data hub output to the remote trailer monitoring system.

Further forms, objects, features, aspects, benefits, advantages, and examples of the present disclosure will become apparent from the accompanying claims, detailed description, and drawings provided herewith.

DETAILED DESCRIPTION

Figure 1:
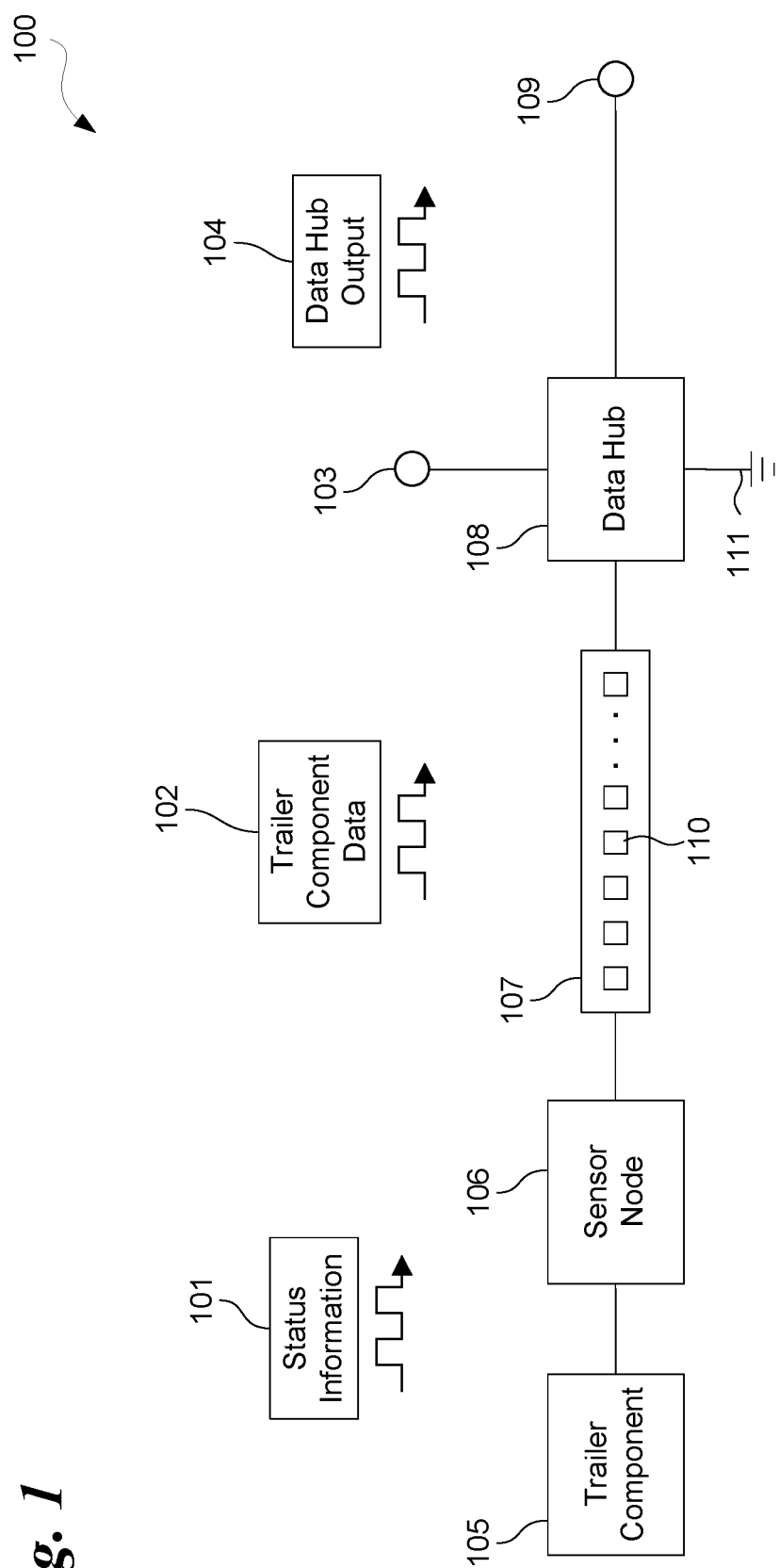
FIG. 1 is a component diagram illustrating components that may be included in the communication system of the present disclosure.

FIG. 1 illustrates at 100 one example of a light strip communication system used here in the context of a truck trailer. In this example, the system 100 may include a sensor node 106 electrically connected to a trailer component 105. The sensor node 106 may be electrically connected to a power circuit 103 and a ground circuit 111. These power and ground circuits are optionally provided by power and ground cables passing from a power source and common ground in the truck to the trailer to provide power and ground connections to the trailer. The sensor node is optionally further configured to receive status information 101 from the trailer component 105. The status information may include any suitable information about the trailer component 105. The sensor node 106 is optionally configured to use the power circuit 103 or the ground circuit 111 to broadcast trailer component data 102 that corresponds to the status of the trailer component 105. This status may include operational information, operating parameters, and the like.

In one example, the trailer component data 102 includes some or all of the data elements present in the status information 101. In another example, sensor node 106 may operate as a data aggregator capturing input from multiple trailer components 105. This aggregated data may then be included in trailer component data 102. In another example, status information 101 is captured by the sensor node 106 and passed through directly and without alteration or aggregation as trailer component data 102. In another example, the sensor node 106 may be configured to reformulate the status information 101 provided by the trailer component 105 and to include the status information 101 with other information provided by sensor node 106.

The disclosed communication system may further include a light strip 107 having one or more lamps 110 that are electrically connected to the power circuit 103 and the ground circuit 111. As used herein, the term "light strip" generally refers to one or more lamps electrically connected together irrespective of their physical arrangement or configuration. The lamps of a light strip as disclosed herein may be arranged in an elongated string sharing a common housing or packaging, or they may be multiple individually packaged lamps in separate housings. In one example, the lamps 110 are optionally electrically connected in series. In another example, lamps 110 may be electrically connected in parallel. In yet another example, the lamps 110 of light strip 107 are electrically connected in a combination of series and parallel.

The disclosed communication system may also include a data hub 108 which may be electrically connected to the power circuit 103 and the ground circuit 111. The data hub 108 is optionally configured to capture the trailer component data 102 that is being broadcasted by the sensor node 106 using either the power circuit 103, the ground circuit 111, or any combination thereof. The data hub 108 is optionally configured and arranged to provide data hub output 104 which corresponds to the trailer component data 102. In one example, the data hub output 104 includes some or all of the data elements present in the trailer component data 102. In another example, the data hub 108 may be configured to reformulate the trailer component data 102 provided by the sensor node 106 and to include the trailer component data 102 with other information in data hub output 104. In another example, data hub 108 may operate as a data aggregator capturing input from multiple sensor nodes 106 (and by extension multiple trailer components 105). This aggregated data may then be included in data hub output 104. In another example, trailer component data 102 is captured by the data hub 108 and passed through as data hub output 104. This data hub output is optionally available at an output terminal 109. Thus the disclosed communication system optionally captures, aggregates, and/or distributes status information about one or more trailer components of a truck trailer using light strips as a data transport medium.

In another aspect, the sensor node 106 may be operable to encode the status information 101 as trailer component data 102 and to broadcast it via light strip 107 to data hub 108. The data hub 108 may be operable to decode the trailer component data 102 and to include the status information 101 in the data hub output 104. In another aspect, the sensor node 106 may be arranged and configured to broadcast the trailer component data 102 as a time varying signal received by the data hub 108. The data hub may then generate a corresponding or matching time varying signal defining data hub output 104. This time varying signal may take any suitable form such as a digital or analog or other signal.

Figure 2:
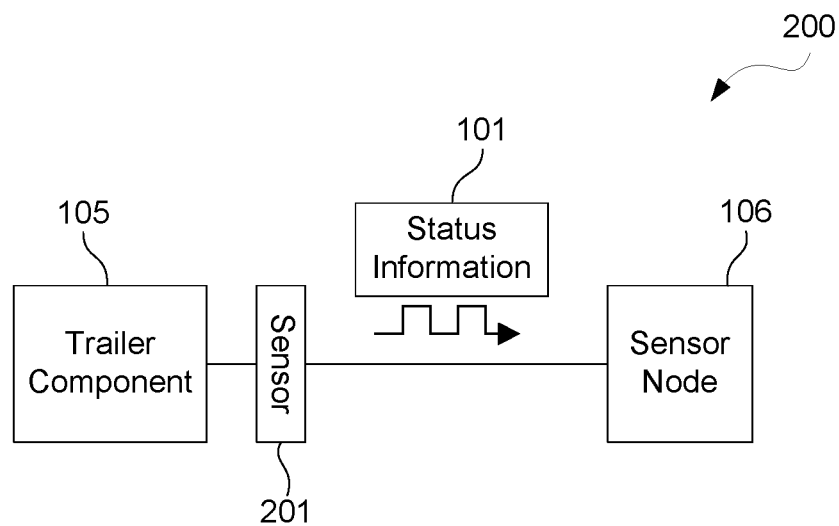
FIG. 2 is a component diagram illustrating an example of components that may be included in a sensor node of the present disclosure.

FIG. 2 illustrates one example of a sensor configuration that may be used in the disclosed system for detecting or obtaining information about trailer components. For example, the disclosed communication system optionally includes a sensor 201 electrically connected to the trailer component 105 and the sensor node 106. The sensor 201 may be responsive to the trailer component 105 and optionally configured to provide the status information 101 about the trailer component 105 for the sensor node 106. In another aspect, the sensor 201, and others like it disclosed herein, may include multiple individual sensing elements or sensing circuitry configured to detect different aspects or operating characteristics of trailer component 105. The individual sensing elements may be separately configured to capture data based on different sense parameters, data which may then be included in status information 101. These sense parameters may include, but are not limited to, present current draw, voltage, pressure, temperature, weight, whether the trailer component is active, or whether the trailer component has flagged certain conditions such as a door open, an error code, a status code, a shift in the position of an item being carried by the trailer, and the like.

In another aspect, the sensor 201 may be separate and distinct from the sensor node 106. In one example, the sensor 201 may be positioned or mounted within a sensor housing, and sensor node 106 is mounted or positioned within another housing separate and distinct from the sensor housing. In another aspect, the sensor 201 and sensor node 106 may be physically separate circuits electrically connected together to operate as one circuit for sensing the status or operating attributes of trailer component 105.

Figure 3:
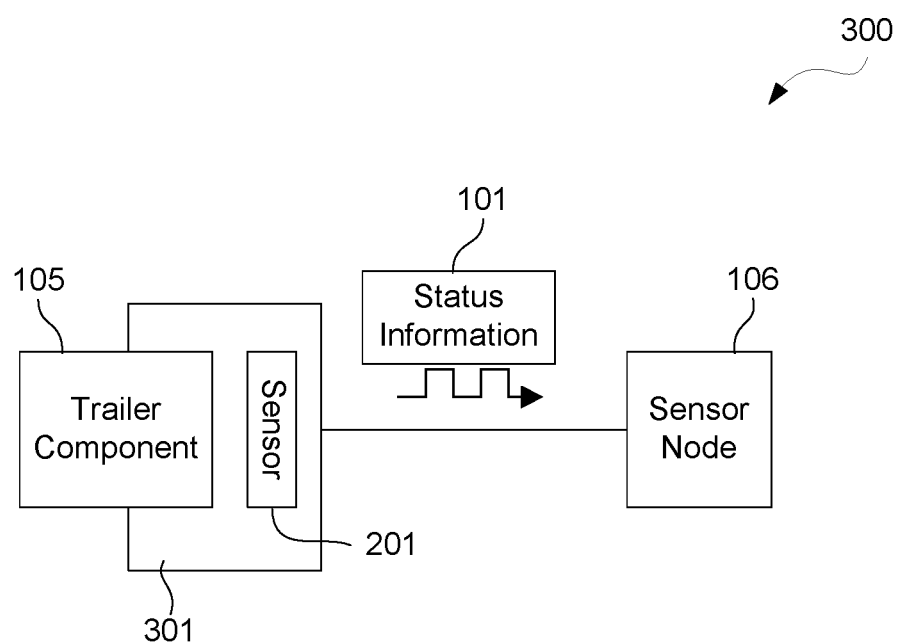
FIG. 3 is a component diagram illustrating another example of components that may be included in a sensor node of the present disclosure.

In another aspect illustrated in FIG. 3 at 300, trailer component 105 may be mounted to the trailer using a mount 301 configured to physically maintain the trailer component 105 in place so as to provide an electrical connection between trailer component 105 and the electrical wiring of the trailer. As illustrated at 300, the mount 301 may include a receptacle configured to accept a portion of trailer component 105 into the mount 301 and may engage the trailer component 105 in any suitable fashion to maintain the trailer component in place. However, any suitable engagement between trailer component 105 and mount 301 may be used where the trailer component fits into, rests on, or is otherwise coupled to mount 301 to name a few non-limiting examples.

In another aspect, mount 301 optionally includes sensor 201. For example, the sensor circuitry in 201 useful for determining the operating state of trailer component 105 may be included in the mount. In one example, the mount 301 is a unitary molded structure that includes some or all of the sensing elements or other sensing circuitry of sensor 201. In another aspect, sensing elements or other circuitry of sensor 201 may by physically positioned between sensor 201 and mount 301 thus providing for physical and/or electrical interaction between trailer component 105 and sensor 205.

Figure 4:
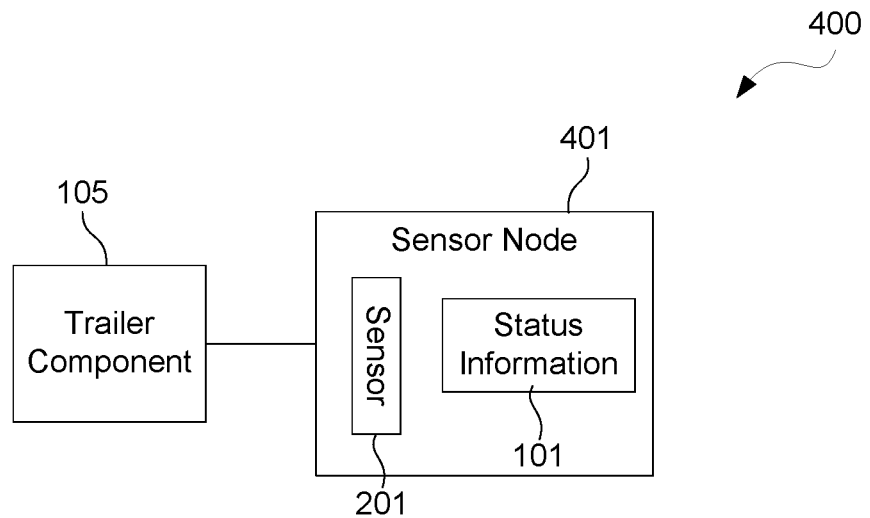
FIG. 4 is a component diagram illustrating another example of components that may be included in a sensor node of the present disclosure.

In another example shown at 400 in FIG. 4, the sensor node 401 optionally includes sensor 201 with the sensor node 401. Sensor 201 may be included in physically separate circuitry that is distinct from other circuits of the sensor node 401. In another aspect, sensor 201 may be included physically, and/or electrically, as part of the circuitry of sensor node 401. In this configuration, sensor node 401 may include the sensing elements or other circuitry as part of the circuits of sensor node 401. In this configuration, status information 101 is generated by the sensor node 401 using input from sensor 201 which is here optionally part of sensor node 401.

Figure 5:
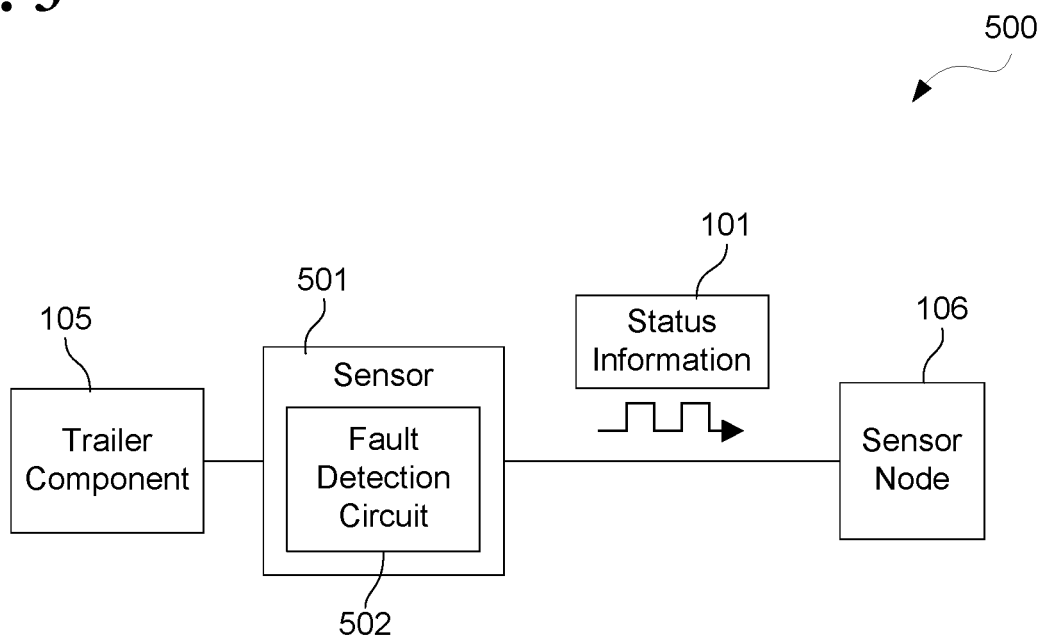
FIG. 5 is a component diagram illustrating another example of components that may be included in a sensor node of the present disclosure.

In another example shown at 500 in FIG. 5, the sensor 501 includes a fault detection circuit 502 arranged and configured to determine when the trailer component 105 is experiencing a fault condition. In another aspect, the fault detection circuit 502 may be configured to determine and report when at least some portion of the trailer component has failed. For example, sensor 501 may include detection circuitry to measure the voltage across the trailer component 105, the current draw of the trailer component, or another aspect of the trailer component's performance.

Figure 6:
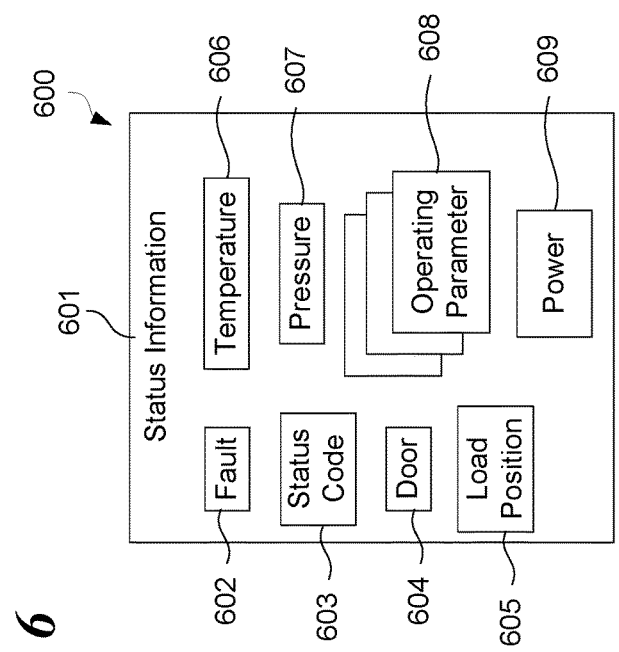
FIG. 6 is a component diagram illustrating one example of status information of the present disclosure.

The disclosed status information may include any suitable information about the trailer component that may be obtained by a sensor node from a trailer component. Examples of the type of status information about the trailer component that may be passed to the sensor node appear in FIG. 6 at 600. In FIG. 6, status information 601 is shown which optionally includes a number of flags, operating parameters, indicators, and the like. For example a fault indicator 602 may be included that may indicate whether or not the trailer component has failed. The fault indicator 602 is optionally useful for providing a fault code or other information specifying the type of failure a trailer component has experienced.

In another aspect, status information 601 may include a status code 603 indicating an operational state of the trailer component. In the case where the trailer component is an LED lamp with multiple individual LEDs, the status indicator 603 may indicate whether the lamp should be replaced, and/or the number of individual LEDs still operating properly. Where the trailer component is an Anti-lock Brake System (ABS) controller, the status code may provide diagnostic information about the components of the ABS system. Status code 603 may thus contain any suitable status information provided by the trailer component.

The status information may include a door indicator 604 indicating whether or not a door of the trailer is open. This may be populated in the case where the trailer component is a door sensor arranged and configured to monitor the open or closed status of a rear door, side door, roof opening, or other opening in the trailer.

In another example, the status information may include a load position indicator 605 provided to indicate the position of a load in (or on) the trailer. For example, load position indicator 605 may provide data about the number or position of boxes, pallets, totes, or other items that are carried by the trailer.

In another aspect, status information may include a temperature indicator 606 indicating a temperature reading obtained by the trailer component. This temperature 606 may be temperature reading for an interior space of the trailer, such as in the case of a refrigerated box trailer. In other examples, the temperature 606 may be a tire temperature for one or more of the trailer's tires, the temperature of oil, air, brake drums or rotors, or another component of the trailer's brake system, the ambient outdoor temperature outside the trailer, and the like.

The status information may include a pressure indicator 607 indicating a pressure reading obtained by the trailer component. This pressure 607 may include an air pressure reading from inside the trailer, outside the trailer, or for a particular pressurized component of the trailer such as the tires, brakes, or refrigeration system.

In another aspect, the status information may include operational parameters 608 which may offer data about the operating parameters of the trailer component. For example, where the trailer component is a backup camera, the operational parameters 608 may include data about the camera settings such as the shutter speed, aperture, or other settings, or whether the infra-red low-light illuminator is activate. Where the trailer component is a refrigeration system controller, the operating parameters 608 may include control settings for the refrigeration system such as upper or lower threshold temperature settings, fan speed settings, and the like. Where the trailer component is a lamp with one or more LEDs, the operational parameters may include programmable aspects for the lamp such as the current location of the lamp on the trailer, the operating mode (e.g. stop, turn, brake, backup, etc.), the color of light the lamp is configured to emit, and the like.

The status information may also include a power indicator 609 with data about the power consumption of the trailer component. This may include voltage, current draw, average power usage, and the like.

Figure 7:
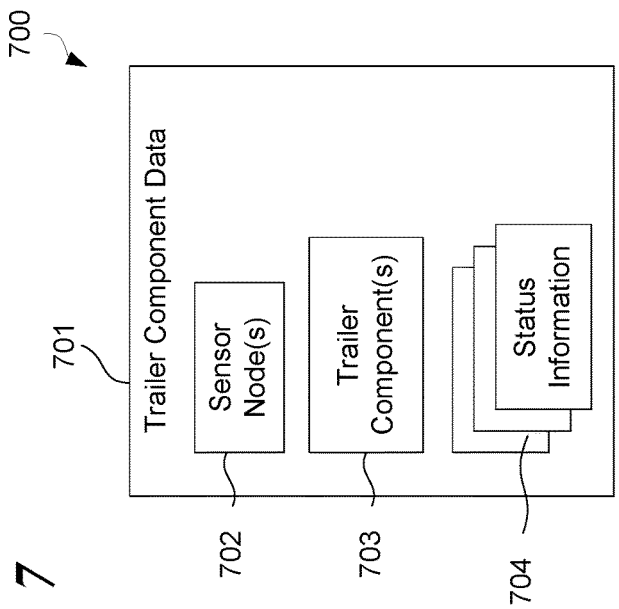
FIG. 7 is a component diagram illustrating one example of trailer component data of the present disclosure.

The disclosed trailer component data may include any suitable information about the trailer component that may be passed from a sensor node to a data hub. Examples of the type of trailer component data that may be passed to the sensor node appear in FIG. 7 at 700. Trailer component data 701 offers one example, but any trailer component data is envisioned. For example, trailer component data my include sensor node identifiers at 702 indicating the sensor node or sensor nodes that provided the information. Trailer component identifiers may be provided at 703 indicating the specific trailer components that contributed to the trailer component data 701. Status information 704 may be included in the trailer component data. This status information may include some or all of the status information provided to the sensor node by the trailer component such as in the case of status information 101, or 601, and the like.

Thus it may be possible for a single trailer component data entity like 701 to refer to one or more sensor nodes, trailer components, and/or status information. In one example, trailer component data 701 may include data about a single sensor node at 702 and a corresponding single trailer component at 703. The status information provided by the trailer component may be included at 704. In another example, trailer component data 701 may include data about a single sensor node at 702 and multiple corresponding trailer components at 703. The status information provided by the multiple trailer components may be included at 704. In another example, trailer component data 701 may include data about multiple individual sensor nodes at 702 and multiple corresponding trailer components at 703. The status information provided by the multiple trailer components may be included at 704.

Figure 8:
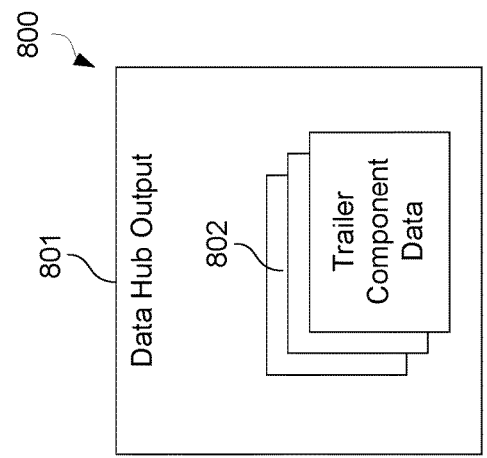
FIG. 8 is a component diagram illustrating one example of data hub output of the present disclosure.

The disclosed data hub output may include any suitable information about the trailer components that may be provided by a data hub. As shown at 800 in FIG. 8, data hub output 801 may include multiple different trailer component data elements. Thus an entity consuming this data hub output may have access to information about trailer components such as trailer component data 102, 701 and the like, which in turn may include references to status information like 101, 601, or others like them. In this way, the disclosed data hub is able to obtain and aggregate data about the components of the trailer.

Figure 9:
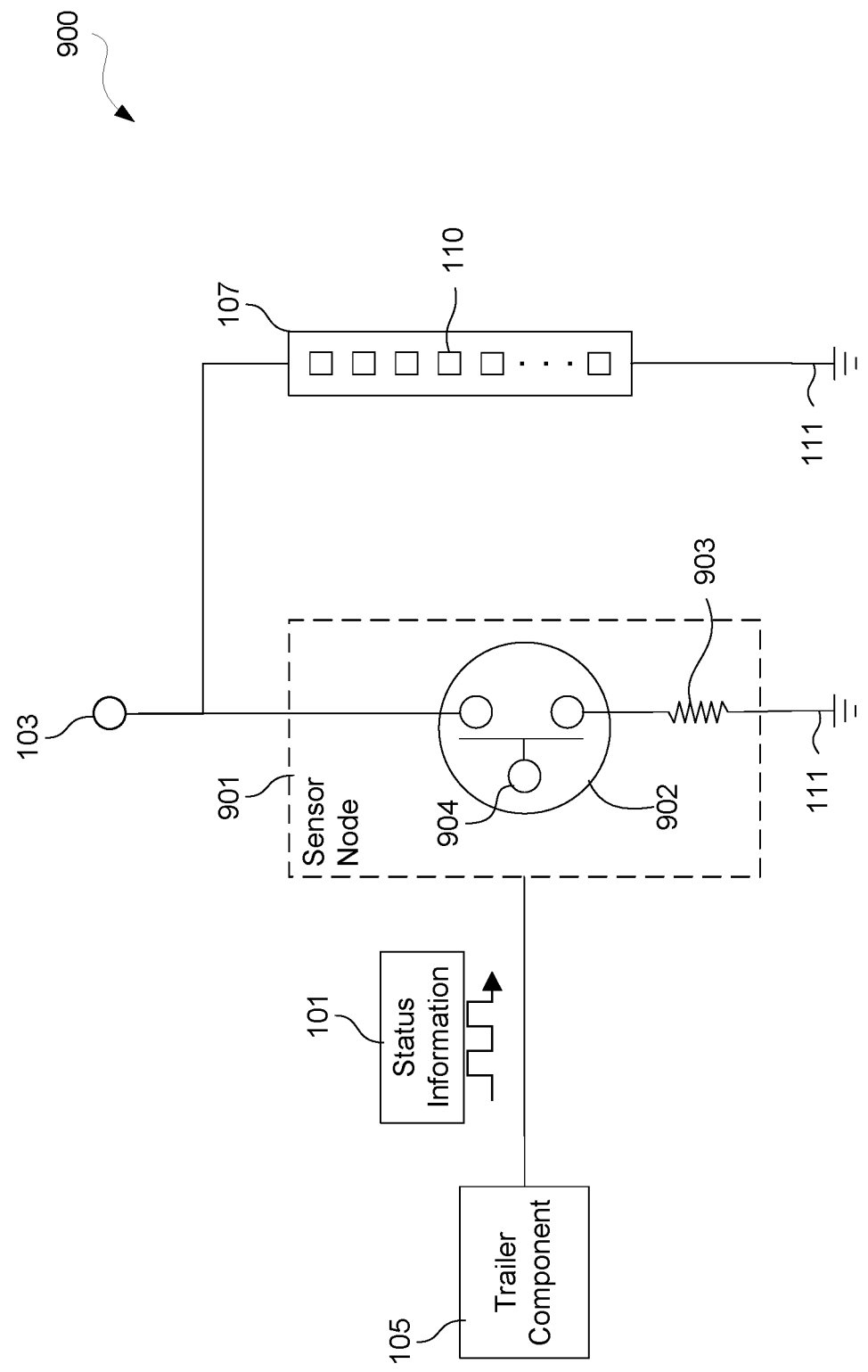
FIG. 9 is a component diagram illustrating another example of components that may be included in a sensor node present disclosure.

One example of a sensor node of the present disclosure electrically connected to a light strip is illustrated in FIG. 9 at 900. The trailer component 105 is here electrically connected to the sensor node 901. Sensor node 901 is optionally electrically connected to power at 103, and ground at 111. Light strip 107 may also be electrically connected to power at 103 and ground 111, and thus light strip 107, and lamps 110 are electrically connected in parallel with sensor node 901.

Sensor node 901 may include a switching device 902 configured to selectively electrically connect and disconnect a shunt resistor 903 to the power circuit 103 in response to the status information 101 about trailer component 105. The switching device may be electrically connected in series with the shunt resister 903. In another aspect, the combination of the switching device 902 and the shunt resistor 903 may be electrically connected in parallel with the light strip 107.

Switching device 902 may include an actuating input 904 for selectively closing and opening the connection between shunt resistor 903 and the power circuit 103. In another aspect, the current provided by the power circuit 103 may be increased when the shunt resistor 903 is connected to power, and optionally decreased when the shunt resistor 903 is disconnected from the power circuit.

Figure 10:
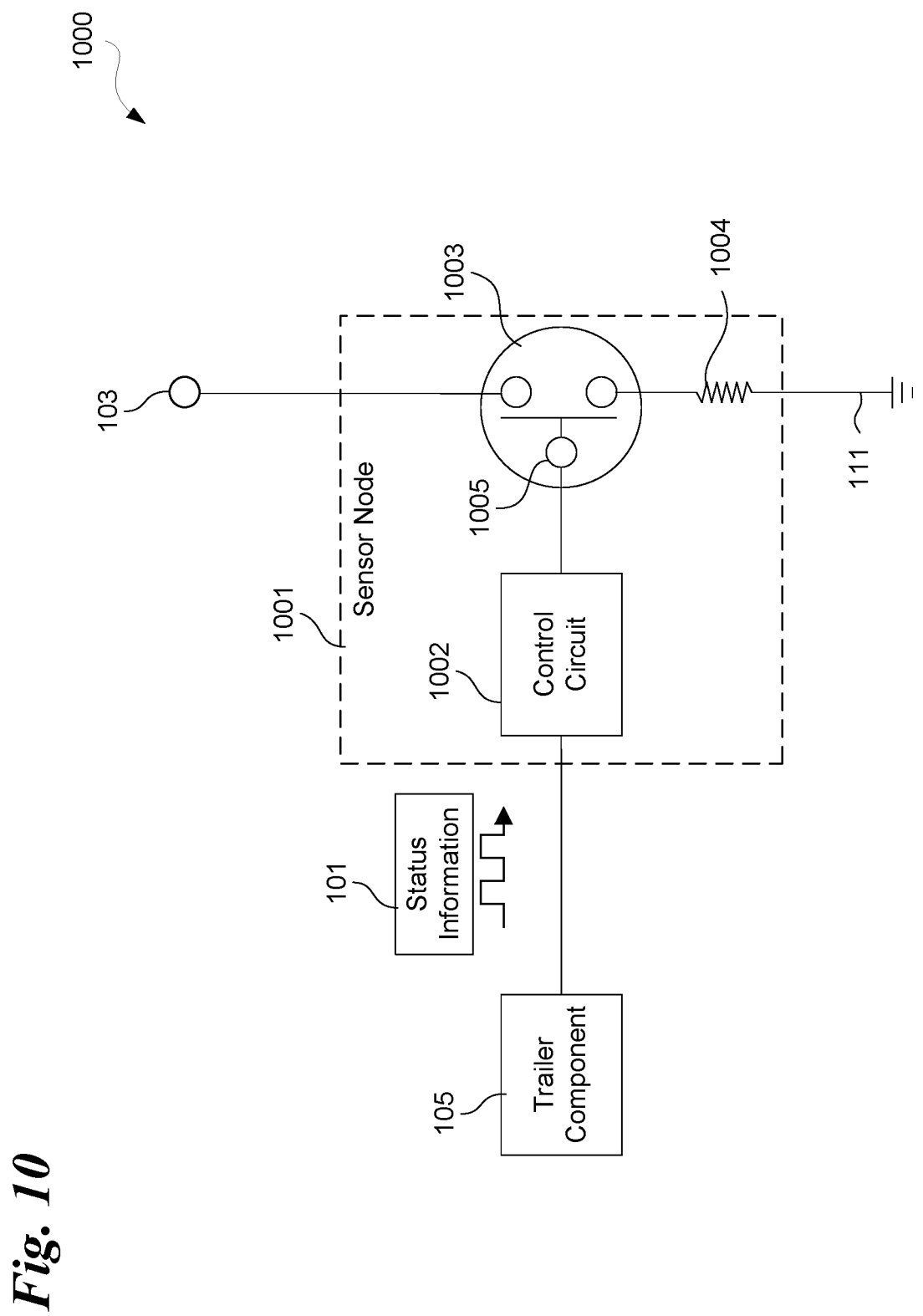
FIG. 10 is a component diagram illustrating another example of components that may be included in a sensor node present disclosure.

Another example of a sensor node is illustrated in FIG. 10 at 1000. The trailer component 105 is electrically connected to the sensor node 1001 so that status information 101 is available to the sensor node. Sensor node 1001 is optionally electrically connected to power at 103, and ground at 111. Sensor node 1001 may include a switching device 1003 configured to selectively electrically connect and disconnect a shunt resistor 1004 to the power circuit 103 and ground 111.

Switching device 1003 may include an actuating input 1005 electrically connected to a control circuit 1002. The control circuit 1002 may be responsive to the trailer component 105 and is optionally configured or programmed to receive the status information 101 and to optionally control the actuating input 1005. In another aspect, control circuit 1002 optionally includes a microcontroller programmed and configured to control the actuating input 1005. The sensor node 1001 is thus operable to encode the status information 101 as trailer component data 102. For example, the sensor node 1001 may encode the trailer component data as a time varying signal that may be digital or analog and may use any suitable encoding scheme.

In this way, the control circuit 1002 may be operable to selectively control the flow of power from power source 103 to shunt resistor 1004 based on the status information input received. Thus, control circuit 1002 may be operable to adjust the current flow from power circuit 103 according to the status information 101 by increasing power from 103 when the shunt resistor 1004 is connected, and optionally decreasing the power from 103 when the shunt resistor 1004 is disconnected from power. This change in current provided across the circuit from power source 103 to ground 111 may then be felt by other components or circuits that are electrically connected in parallel to sensor node 1001.

Figure 11:
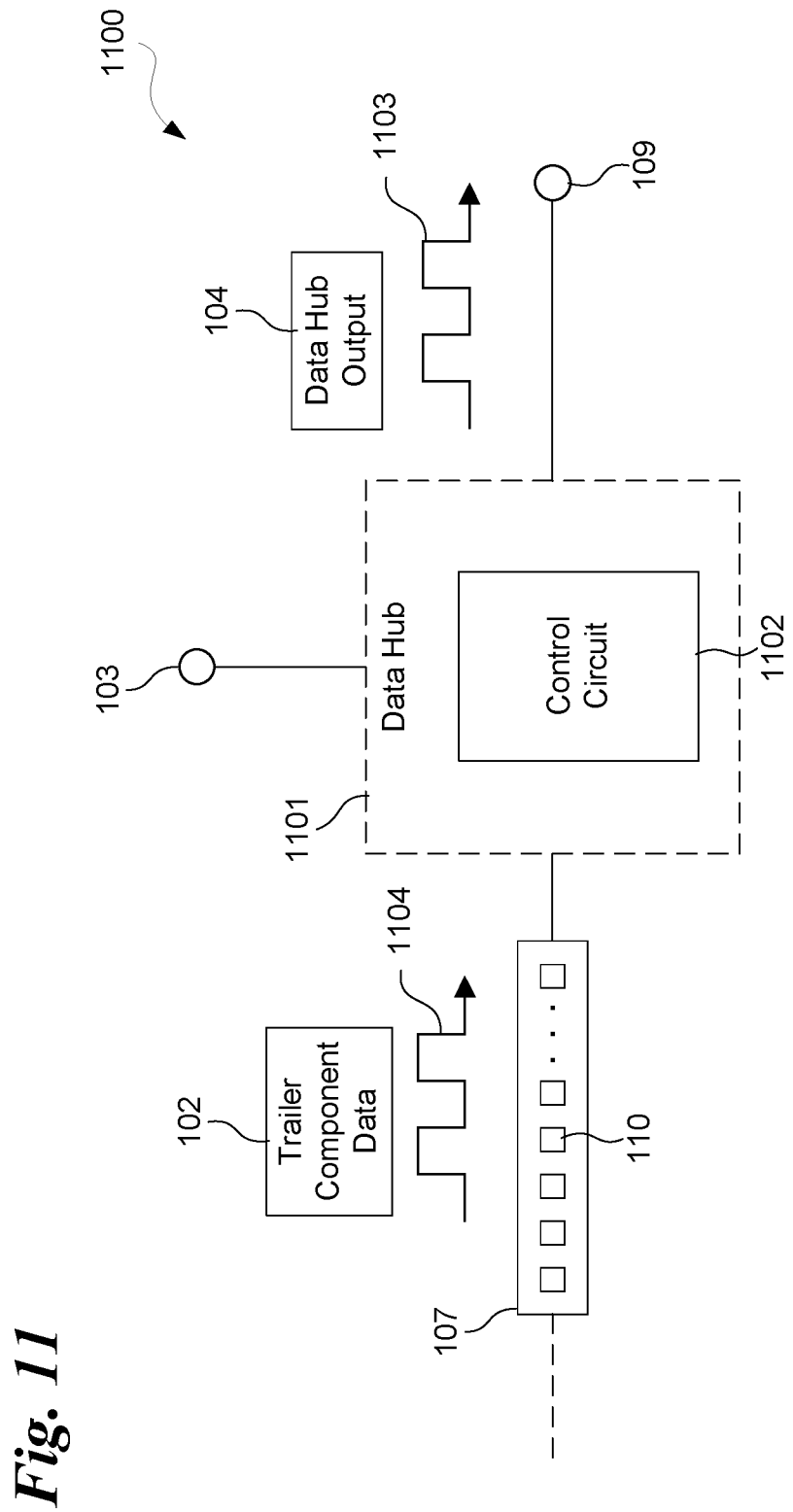
FIG. 11 is a component diagram illustrating an example of components that may be included in a data hub of the present disclosure.

FIG. 11 illustrates another example of a data hub as shown at 1100. Data hub 1101 optionally includes a control circuit 1102 that may be programmed and configured to decode, generate, or otherwise provide, the data hub output 104 based on the trailer component data 102. Control circuit 1102 may include a microcontroller or other device, or group of cooperating devices, programmed or configured to derive the output from the trailer component data. In this example the disclosed upstream sensor node (such as node 106, 401, and the like) may be operable to encode the disclosed status information as trailer component data 102, and the control circuit 1102 may be operable to decode the trailer component data 102 and to include the status information in the data hub output 104. Where the disclosed sensor nodes broadcast the trailer component data as a time varying signal 1104, the data hub 1101 may receive this signal 1104 and use the control circuit 1102 to generate or otherwise provide data hub output 104 that includes or is defined by a time varying signal 1103 that optionally corresponds with or matches the time varying signal 1104. Thus data hub 1101 may operate to accept input that is stored, aggregated, or otherwise processed before being resent. The control circuit 1102 may reformulate the received data and provide new corresponding output, or pass the received data in original form without change.

Figure 12:
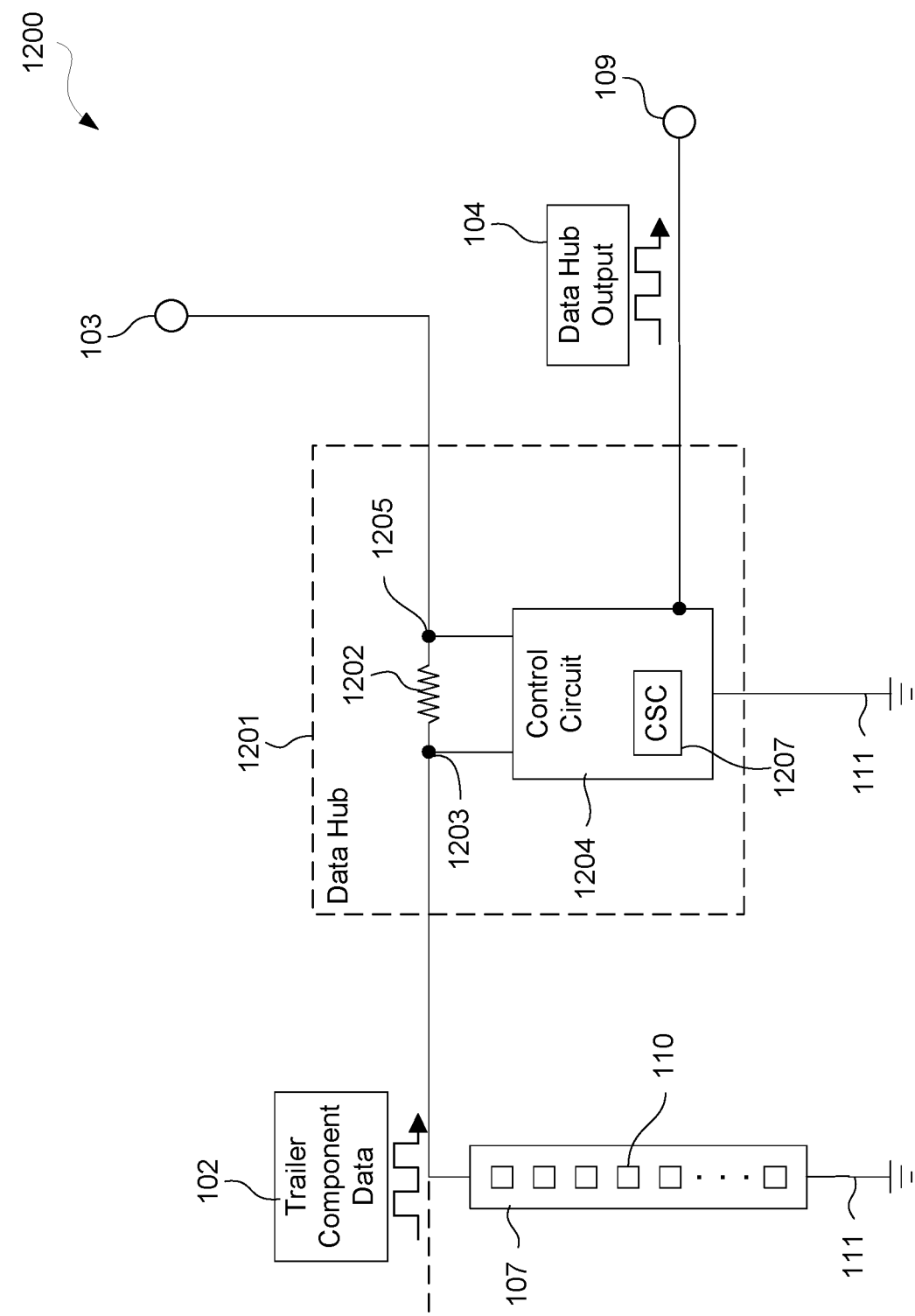
FIG. 12 is a component diagram illustrating another example of components that may be included in a data hub present disclosure.

FIG. 12 illustrates another configuration of a data hub 1201 at 1200. The data hub 1201 optionally includes a control circuit 1204 programmed and configured to obtain the data hub output 104 from the trailer component data 102. Control circuit 1204 optionally includes a processor or microcontroller or other device, or group of cooperating devices, programmed or configured to derive the data hub output from the trailer component data. The data hub 1201 optionally includes a sense resistor 1202 electrically connected in the power circuit in series with the light strip 110. As illustrated at 1200, power circuit 103 passes through sense resistor 1202 and thus 1202 is upstream from light strip 107.

Control circuit 1201 may include a current sensing circuit 1207 that is electrically connected in parallel to the sense resistor 1202 at node 1203 and node 1205. Light strip 107 may be electrically connected to node 1203, or to a node downstream from node 1203. Control circuit 1201 may also be electrically connected to ground 111. Thus, the control circuit 1201 and current sensing circuit 1207 may be electrically connected in parallel with the light strip 107 and the sense resistor 1202 and may thus be operable to detect changes in current passing through the sense resistor 1202. These changes in current correspond with changes in current flowing from power circuit 103 to ground 111.

Such changes in current may be detected by the current sensing circuit 1207 and interpreted by the control circuit 1204 as trailer component data 102. The trailer component data 102 may thus be defined by time varying changes in current of the power circuit 103, the current optionally varying between a first level and a second level higher than the first level. The control circuit 1204 may be programmed or configured to interpret this input trailer component data and to generate from it data hub output 104 at the output terminal 109. Thus the data hub output 104 may be accessible from data hub 1201 via the terminal 109 allowing other components or circuits to access information about the behavior or operating state of trailer components in a trailer using a light strip.

Figure 13:
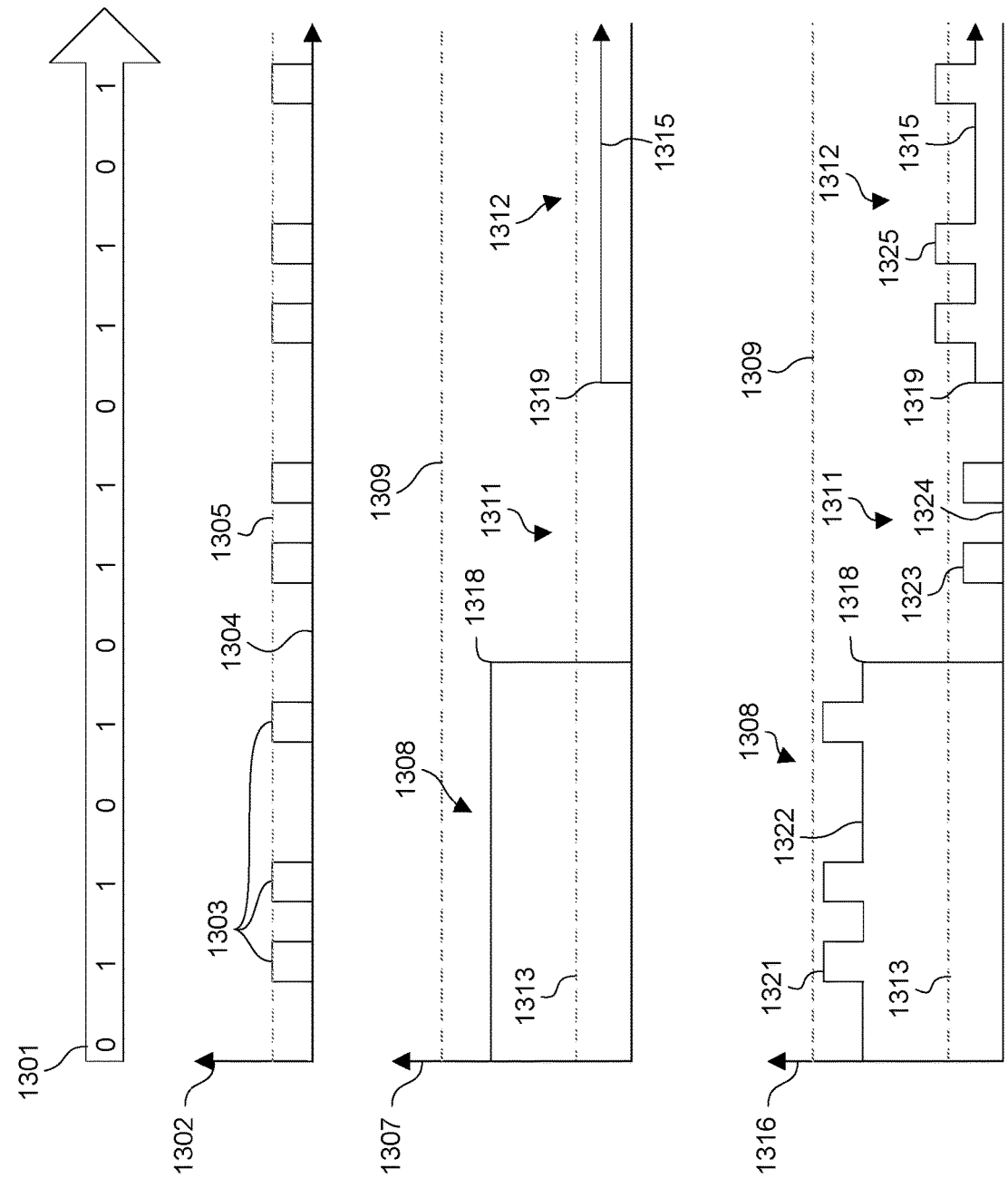
FIG. 13 is a timing diagram illustrating operational aspects of the communication system of the present disclosure.

Examples of the disclosed time varying current levels are illustrated at 1300 in FIG. 13. At 1300, the trailer component data is transmitted using power circuit 103 using a digital signaling approach. However, an analog signaling scheme may be implemented, or any other suitable signaling scheme. In the graphs shown at 1300, time travels from left to right, right being most recent, and current levels vary from bottom to top or lower to higher respectively.

Trailer component data 105 is represented as a digital stream 1301 with individual bits represented as 1s and 0s streaming over time. A graph 1302 illustrates the data being transmitted with pulses in the current 1303 corresponding to the data stream 1301. The trailer component data 1301 is optionally defined by a time varying change in current which may vary between a first level 1304 (here about 0 amps) and a second level 1305 that is at least somewhat higher than the first level at 1304. The second current level 1305 may be less than 5 milliamps, less than 50 milliamps, or less than 250 milliamps, or it may be 250 milliamps or more. Any suitable difference between the first and second current levels 1304 and 1305 may be used.

Current that is drawn by the lamps of the disclosed light strip is illustrated in graph 1307 with the current varying over time. A minimum threshold 1313 illustrates a minimum current level required to activate the lamps 110 in the light strip 107. This minimum current level 1313 is defined by the type of lamps used in the light strip according to their specific power requirements. For example, LED lamps generally require significantly less current to activate than incandescent lamps that provide about the same level of illumination.

A maximum current level is illustrated at 1309. At 1308, one or more of the lamps in the light strip are in an activated or illuminating state and are thus drawing current at a first level that is great than the minimum current level 1313. At 1318, the light strip lamps are deactivated so that the current level at 1311 is about 0 amps. At 1319, the current in the light strip is elevated to a level 1315 that is less than the minimum required to activate the lamps in the light strip. Thus at 1308, the lamps 110 are actively illuminating until 1318, and then remain inactive at 1311. The somewhat elevated current level at 1312 is by itself insufficient to activate the lamps.

As noted herein elsewhere, the disclosed sensor node may be configured to accept input from the trailer component(s) and then alter the current flowing through the power circuit accordingly so as to transmit a time varying signal defining aspects of the input received by the sensor node. In the example shown at 1300, this is done by selectively increasing the current level in the power circuit. However, any suitable technique may be used such as by selectively decreasing the current level.

One example of the resulting overall current levels for the current flowing through the light strip 107 is illustrated in graph 1316. The graph 1316 may therefore be considered a composite of graphs 1302 and 1307. The trailer component data 1301 is defined by a time varying change in current shown at 1308 as varying between a first level 1322 and a second level 1321 that is higher than the first level 1322. At 1308, the lamps of the light strip are illuminated, and thus both levels 1322 and 1321 are greater than the minimum current level 1313. Also, second level 1321 is less than the maximum level 1309.

The trailer component data 1301 is further defined at 1311 after the lamps are deactivated at 1318. At 1311, the time varying change in current varies between a first level 1324 and a second level 1323 that is higher than the first level 1324. At 1311, the lamps of the light strip are not activated, and thus both levels 1323 and 1324 are less than the minimum current level 1313. However, the data stream continues through both 1308 and 1311, passing data through the light strip regardless of whether the lamps are activated or not.

As noted above, current may optionally flow through light strip 107 at 1319, but at a lower level 1315 than the minimum level 1313 that is required to activate the lamps. Thus at 1312 is illustrated a situation where the trailer component data is defined by a time varying signal that varies between a first level 1315 and a second level 1325 that is higher than the first level 1315. In this example, the first level 1315 is less than the minimum current level 1313, and the second level 1325 is greater than the minimum current level 1313. If the frequency of the changes in current at 1312 is low enough, the data may be visible as a flickering of the light strip as the lamps are activated and deactivated.

In any of the disclosed examples regarding a time varying circuit, any frequency may be used. For example the result data signal provided by the sensor node 106 may be greater than 100 Hz, greater than 1000 Hz, greater than 10,000 Hz or more. In the examples at 1308 and 1312, the pulsing of current levels may create a flicker in the lamps of light strip 110 if the frequency is low enough. For example, at 1308, the lamps may remain active, but pulse to a noticeably brighter degree when transmitting. At 1312, the lamps may remain inactive except for possibly dim flickering when transmitting as the lamps are activated and deactivated. In either case, increasing the frequency of the time varying data signal provided at 1302 may reduce or eliminate any flickering which may be an undesirable side effect.

Figure 14:
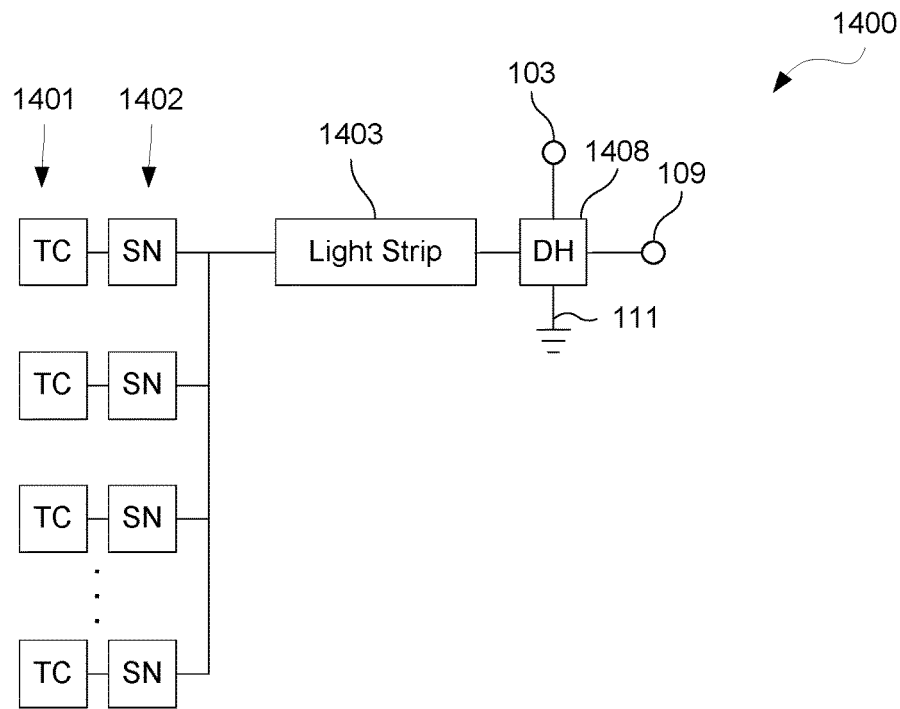
FIG. 14 is a component diagram illustrating an alternative configuration for the communication system of the present disclosure.

The disclosed system for communicating between a trailer component and a data hub using a light strip may be configured and arranged in any suitable fashion or topology, some examples of which are illustrated in FIGS. 14-17. FIG. 14 illustrates one example at 1400 with multiple individual trailer components at 1401 each with a connection to separate individual sensor nodes at 1402. Each electrical connection of each trailer component at 1401 is separate and distinct and corresponds with one sensor node at 1402. All of the sensor nodes 1402 are electrically connected to a single light strip 1403, and the single light strip is electrically connected to a single data hub 1408. Thus data hub 1408 communicates according to the present disclosure with multiple sensor nodes at 1402 via a single light strip 1403, and the multiple sensor nodes are individually connected to separate trailer components at 1401.

Figure 15:
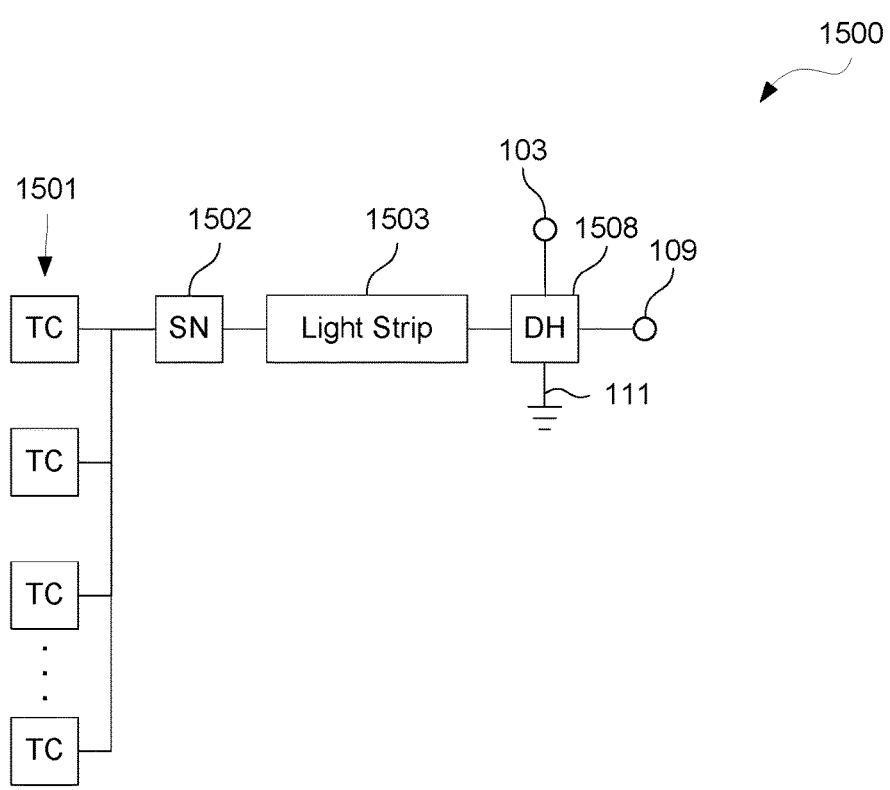
FIG. 15 is a component diagram illustrating another alternative configuration for the communication system of the present disclosure.

FIG. 15 illustrates another example at 1500 with multiple individual trailer components at 1501 each with a single connection to a sensor node 1502. Each electrical connection between each trailer component at 1501 is shared with all other sensors at 1501 as all connect to a single individual sensor node 1502. The sensor node 1502 is electrically connected to a single light strip 1503, and the single light strip is electrically connected to a single data hub 1508. In this example, the single data hub 1508 communicates as disclosed herein with multiple trailer components at 1501 via a single light strip 1503 and a single sensor node 1502.

Figure 16:
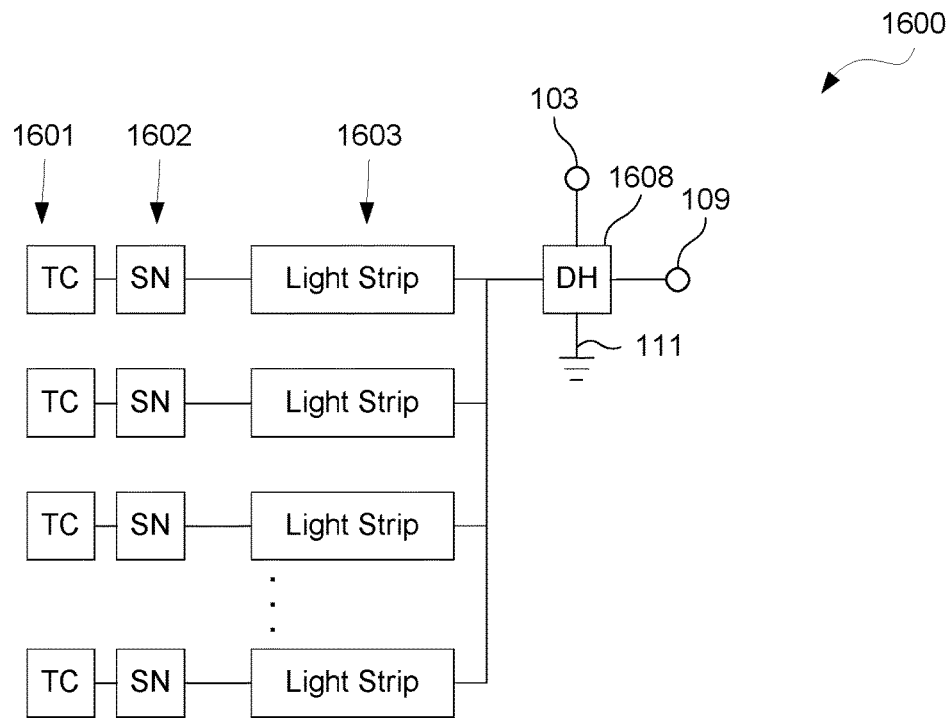
FIG. 16 is a component diagram illustrating another alternative configuration for the communication system of the present disclosure.

FIG. 16 illustrates another example at 1600 with multiple individual trailer components at 1601 each with a separate and distinct connection to a corresponding sensor node at 1602. Each sensor node has a separate and distinct connection to a corresponding light strip at 1603. All of the light strips at 1603 are electrically connected to data hub 1608. In this example, the single data hub 1608 communicates according to the present disclosure with multiple trailer components at 1501 via multiple sensor nodes electrically connected to multiple individual light strips at 1603.

Figure 17:
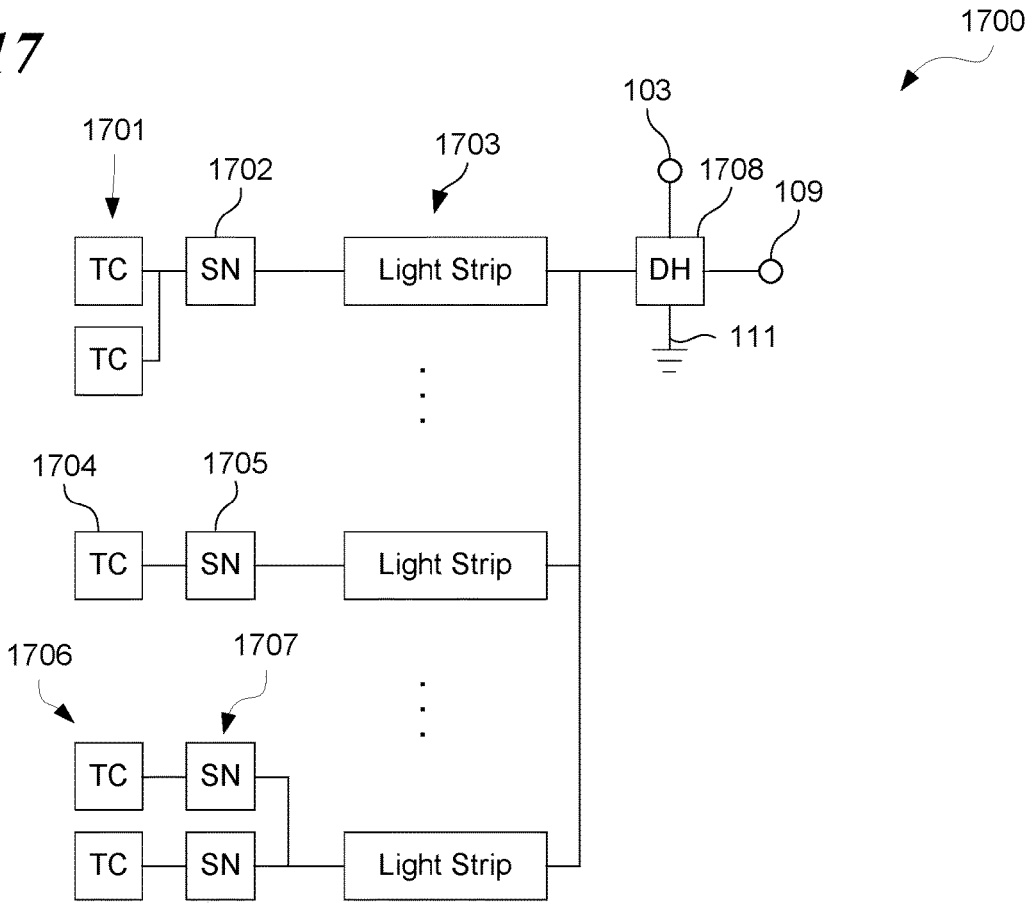
FIG. 17 is a component diagram illustrating another alternative configuration for the communication system of the present disclosure.

In yet another example shown at 1700 in FIG. 17, a mixed approach is taken with multiple light strips at 1703 communicating with a single data hub 1708 using an electrical connection that is shared by all light strips in the system. In one aspect, a single sensor node 1702 communicates with the data hub 1708 with an electrical connection to a light strip at 1703 that is separate and distinct from electrical connections to other of the light strips at 1703. The sensor node 1702 is electrically connected to multiple trailer components at 1701 via an electrical connection shared by the multiple trailer components.

In another aspect, trailer component 1704 is electrically connected to a different sensor node 1705, and this electrical connection is separate and distinct from the electrical connections between other trailer components and other sensor nodes in this example of the system. The sensor node 1705 is electrically connected to a light strip at 1703 by a connection that is separate and distinct from other such connections between a sensor node and a light strip. In another aspect, multiple trailer components at 1706 are electrically connected to multiple sensor nodes by connections that are distinct and separate from each other. The multiple sensor nodes at 1707 share a common electrical connection to a light strip at 1703.

FIGS. 14-17 illustrate that any suitable combination of mechanical or electrical connections between light strips, sensor nodes, and trailer components is contemplated by the present disclosure. Also, many of the disclosed examples may suggest a sensor node and trailer component at one end of the light strip, and a data hub at the opposite end. Although this is one possibly advantageous configuration, it is not the only possible configuration. For example, sensor nodes made be electrically connected at any point along a light strip, or between multiple light strips connected to a common power and ground circuit.

Figure 18:
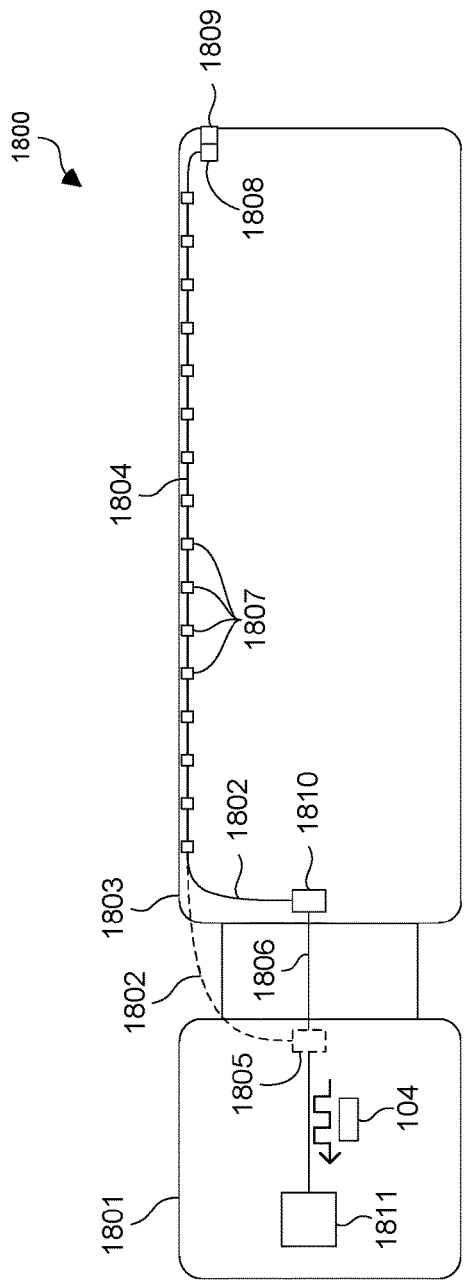
FIG. 18 is a component diagram illustrating another example of the communication system of the present disclosure in a truck and trailer.

FIG. 18 illustrates at 1800 an example of the disclosed communication system in use with a truck and trailer. In this example, a light strip 1804 of the present disclosure is mounted to a truck trailer 1803 that is coupled to a truck tractor 1801. The truck tractor 1801 includes at least one trailer monitoring user interface 1811 that is configured to receive data hub output 104 from a data hub. The trailer monitoring user interface 1811 is responsive to a data hub 1805 optionally mounted in the truck tractor 1801, or a data hub 1810 that may be mounted in the trailer 1803. A trailer component 1809 is optionally in communication with a sensor node 1808, and sensor node 1808 may communicate with the data hub via light strip 1804 according to the present disclosure. Light strip 1804 is similar to others of the present disclosure and may include multiple lamps 1807. The light strip 1804 is optionally electrically connected to the hub by an electrical connection 1802.

The trailer monitoring user interface 1811 is optionally configured to provide information about the trailer component in response to the data hub output 104 broadcasted or otherwise provided by the data hub. The connection between the data hub 1805 or 1810 and the trailer monitoring user interface 1811 may be provided by a communication link 1806. In one example, communication link 1806 includes one or more cables. In another example, the communication link includes a wireless data connection between the hubs 1805 or 1810 and the user interface 1811.

Figure 19:
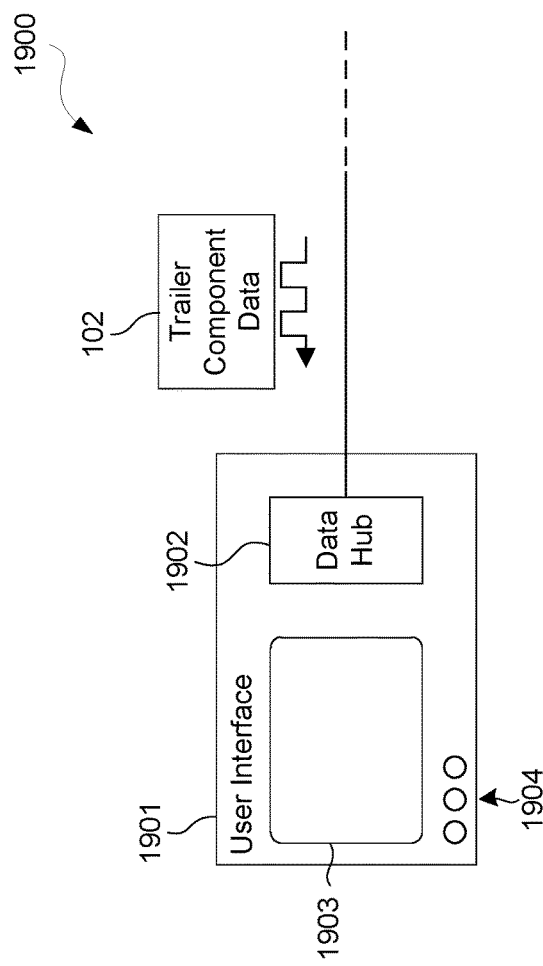
FIG. 19 is a component diagram illustrating additional aspects of the system of FIG. 18.

In another aspect is illustrated in FIG. 19 where one example of a trailer monitoring user interface is shown at 1900. The interface at 1900 optionally includes a housing 1901 and user I/O devices such as a display device 1903. The display device 1903 may be configured to provide output to a user, or to accept input, such as in the case of a touch screen. Other I/O devices may be included at 1904 such as buttons, toggles, levers, switches, keys, and the like. In this example, a data hub 1902 of the present disclosure is optionally mounted in a common housing 1901 as part of the trailer monitoring user interface 1900.

Figure 20:
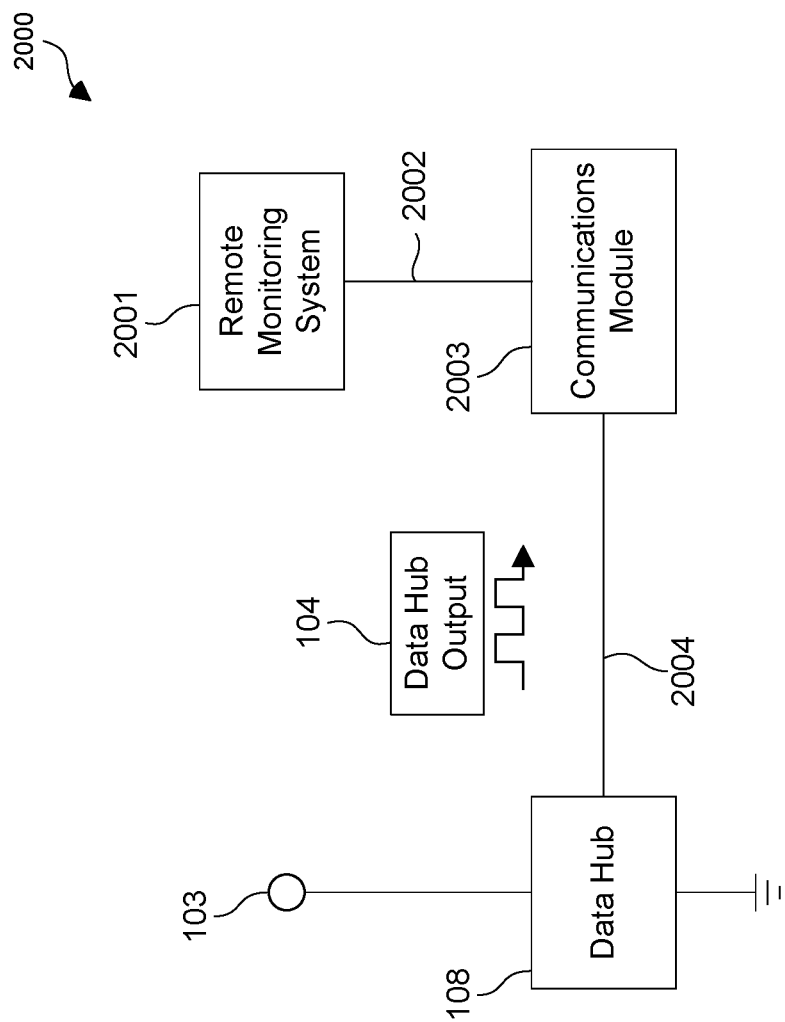
FIG. 20 is a component diagram illustrating additional aspects that may be included in the communication system of the present disclosure.

The disclosed trailer communication system may include other aspects which facilitate external and/or remote monitoring of the trailer components. In one example illustrated at 2000 in FIG. 20, the disclosed communication system optionally includes a communication module 2003 configured to activate and/or maintain a communication link 2002 with a remote trailer monitoring system 2001. The communication module 2003 is optionally electrically connected to a data hub 108 of the present disclosure and is configured to receive data hub output 104. The communication module is programmed or otherwise arranged and configured to relay the data hub output 104 to the remote trailer monitoring system 2001 thus providing the option for the monitoring system to obtain detailed data about the behavior and status of the trailer components of a trailer that may be at a location remote from the monitoring system. Monitoring system 2001 may be configured to process and analyze the trailer data to track its movements, maintain maintenance records, and/or provide updates, such as alerts communicated to the driver or others.

Figure 21:
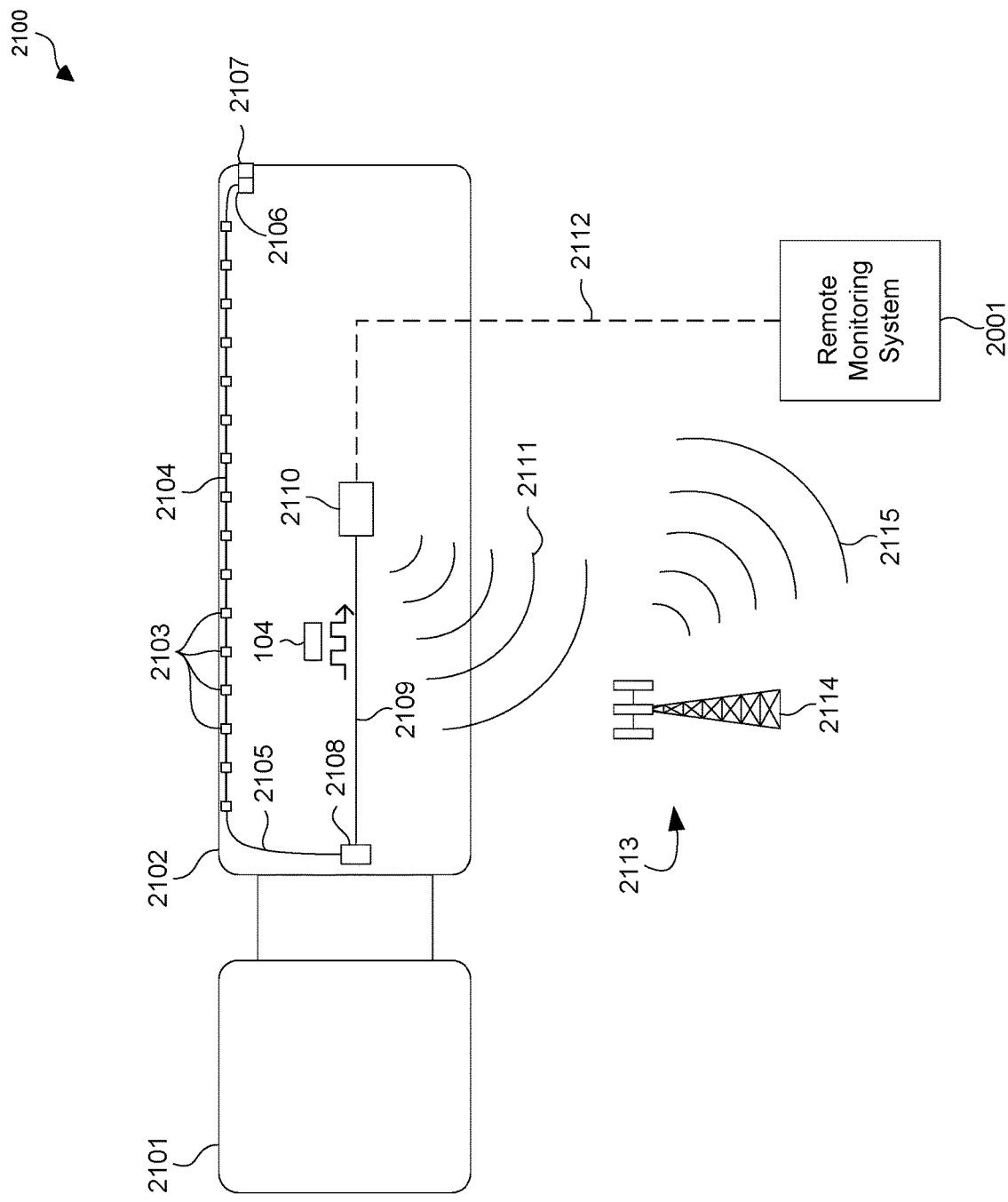
FIG. 21 is a component diagram illustrating aspects of the system of FIG. 20 in a truck and trailer.

An example of this configuration is illustrated at 2100 in FIG. 21 where a truck 2101 is optionally coupled to a trailer 2102. The trailer 2102 optionally includes a light strip 2104 with multiple lamps 2103. The light strip 2104 may be electrically connected at 2105 to a data hub 2108 of the present disclosure. The data hub 2108 may also be electrically connected to a communications module 2110 by a connection 2109, and thus the communications module 2110 may be configured to receive data hub output 104.

Communications module 2110 may be configured to activate and maintain a communications link with remote monitoring system 2001. This link may include a cabled connection 2112, or a wireless connection 2113 optionally involving one or more wireless links 2111 and 2115. This connection may include one or more repeating transmitters 2114 such as a cell tower in the case where connection 2113 is a cellular data connection. Any suitable wired or wireless connection between the communications module 2110 and the remote monitoring may be used. For example, wired connection 2112 may be a USB connection, Ethernet connection, and the like. Wireless communications link 2113 may include the use of any suitable wireless protocols such as WiFi, Bluetooth, Near Field Communication (NFC), LiFi, and the like.

Figure 22:
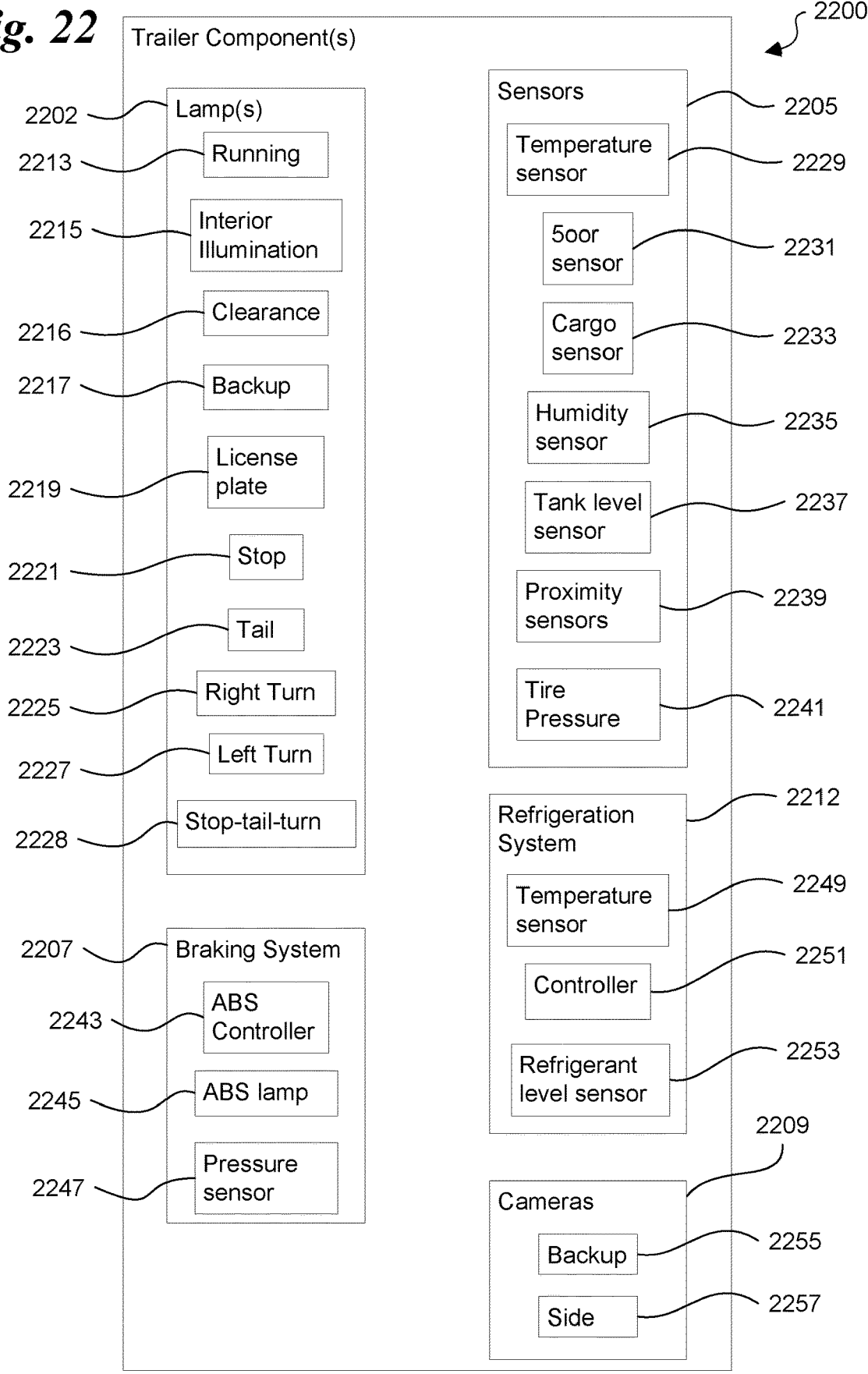
FIG. 22 is a component diagram illustrating examples of trailer components of the present disclosure.

Examples of the disclosed trailer components discussed herein elsewhere are shown in FIG. 22. The trailer components shown at 2200 in FIG. 22 are merely examples of components that might be included in a trailer of the present disclosure, and should not be construed as an exhaustive list or as otherwise limiting the types of components envisioned. Other components may be included while some listed here may be excluded depending on the type of trailer and other factors.

The trailer components 2200 may include lamp(s) 2202, braking system 2207, sensors 2205, cameras 2209, and/or refrigeration system 2212. For example, lamp(s) 2202 may include, but are not limited to, running lamps 2213, interior illumination lamps 2215 for lighting the interior of the trailer, side marking/clearance/identification lamps 2216 for marking extremities of the trailer, backup 2217 for illuminating the area behind the trailer, license plate lamp(s) 2219 for lighting license plates and other identifying indicia mounted on the trailer, stop lamps 2221 that may illuminate when the vehicle is actively braking, tail lamps 2223, left turn lamps 2227 and right turn lamps 2225, and, stop-tail-turn 2228. In another aspect, lamp(s) 2202 may include one or more LEDs.

The sensors 2205 may include any of temperature sensor 2229 for sensing the temperature in and/or around the trailer, door sensor 2231 configured to optionally sense when trailer doors are open or closed, cargo sensor 2233 configured to optionally sense weight, location, and/or other attributes of cargo in or on the trailer, humidity sensor 2235 for optionally sensing absolute or relative humidity in and/or around a trailer, tank level sensor 2237 optionally for sensing the level of fluids (liquids or gases) carried by the trailer, proximity sensor 2239 optionally for sensing proximity of the trailer relative to nearby objects, and/or tire pressure sensor 2241 optionally for sensing pressure levels in tires of the trailer.

The braking system 2207 may optionally include an anti-lock Brakes (ABS) controller 2243 for controlling the ABS braking system, 2245 optionally for indicating the status or failure of the braking system 2207, and/or pressure sensor 2247 optionally included to sense changes in hydraulic or air pressure in braking system 2207. Other optional trailer components include cameras 2209 such as one or more backup cameras 2255 for optionally capturing a view of the surrounding area directly behind the trailer, and one or more side cameras 2257 for optionally capturing a view of areas adjacent the sides of the trailer.

Components of refrigeration system 2212 may include temperature sensor 2249 for determining the temperature inside the refrigerated cargo area of the trailer, controller 2251 configured to control the refrigeration cycle in the refrigeration system, and refrigerant level 2253 for determining the level of refrigerant in refrigeration system 2212.

Other examples of the disclosed concepts include the following numbered examples:

Example 1

A communication system for a trailer that includes a sensor node electrically connected to a trailer component, wherein the sensor node is electrically connected to a power circuit and a ground circuit, wherein the sensor node is configured to receive status information about the trailer component, and wherein the sensor node is configured to use the power circuit or the ground circuit to broadcast trailer component data that corresponds to the status of the trailer component; a light strip having one or more lamps electrically connected to the power circuit and the ground circuit; and a data hub electrically connected to the power circuit and the ground circuit, the data hub configured to capture the trailer component data broadcasted by the sensor node on the power or ground circuits and to provide corresponding data hub output.

Example 2

The communication system of example 1 including a sensor electrically connected to the trailer component and the sensor node, wherein the sensor is responsive to the trailer component and is configured to generate the status information about the trailer component for the sensor node.

Example 3

The communication system of any preceding example, wherein the status information about the trailer component includes a fault indicator indicating whether or not the trailer component has failed.

Example 4

The communication system of any preceding example, the sensor including a fault detection circuit arranged and configured to determine when the trailer component has failed.

Example 5

The communication system of any preceding example, wherein the status information includes a temperature indicator indicating a temperature reading obtained by the trailer component.

Example 6

The communication system of any preceding example, wherein the status information includes a door open indicator indicating whether or not a door of the trailer is open.

Example 7

The communication system of any preceding example, wherein the status information includes a pressure indicator indicating a pressure reading obtained by the trailer component.

Example 8

The communication system of any preceding example, wherein the status information includes a status code indicating an operational state of the trailer component.

Example 9

The communication system of any preceding example, wherein the status information includes operational parameter values indicating operating parameters of the trailer component.

Example 10

The communication system of any preceding example, wherein the sensor is separate and distinct from the sensor node.

Example 11

The communication system of any preceding example, wherein the sensor is mounted in a receptacle of the trailer component.

Example 12

The communication system of any preceding example, wherein the sensor is included with the sensor node.

Example 13

The communication system of any preceding example, wherein the sensor node includes a control circuit responsive to the trailer component input; and a switching device responsive to the control circuit, wherein the switching device is configured to selectively electrically connect and disconnect a shunt resistor to the power circuit in response to the control circuit.

Example 14

The communication system of any preceding example, wherein the current in the power circuit is increased when the shunt resistor is connected to power, and wherein the current in the power circuit is decreased when the shunt resistor is disconnected from the power circuit.

Example 15

The communication system of any preceding example, wherein the data hub is configured to measure changes in current flowing through the power circuit and to generate the data hub output accordingly.

Example 16

The communication system of any preceding example, wherein the data hub includes a control circuit responsive to changes in current passing through a sense resistor, wherein the sense resistor is electrically connected in series upstream in the power circuit from the light strip.

Example 17

The communication system of any preceding example wherein the trailer component data is defined by time varying changes in current of the power circuit, the current varying between a first level and a second level higher than the first level.

Example 18

The communication system of any preceding example, wherein the light strip defines a minimum current level required to activate the one or more lamps of the light strip, and wherein the trailer component data is defined by a time varying change in current between a first level and a second level higher than the first level.

Example 19

The communication system of any preceding example, wherein the second level is less than the minimum current level.

Example 20

The communication system of any preceding example, wherein the first level is greater than the minimum current level.

Example 21

The communication system of any preceding example, wherein the light strip defines a maximum current level for the lamps of the light strip, and wherein the second level is less than the maximum level for the lamps.

Example 22

The communication system of any preceding example, wherein the first and second levels are less than the minimum current level.

Example 23

The communication system of any preceding example, wherein the first level is less than the minimum current level, and wherein the second level is greater than the minimum current level.

Example 24

The communication system of any preceding example, wherein the data signal defines a frequency of greater than 100 Hz.

Example 25

The communication system of any preceding example, wherein the data signal defines a frequency of greater than 10,000 Hz.

Example 26

The communication system of any preceding example, wherein the sensor node is electrically connected in parallel with the lamps of the light strip.

Example 27

The communication system of any preceding example, wherein the sensor node includes a switching device configured to selectively electrically connect and disconnect a shunt resistor to the power circuit in response to the information about the trailer component, wherein the switching device is electrically connected in series with a shunt resister, and wherein the combination of the switching device and the shunt resistor are electrically connected in parallel with the light strip.

Example 28

The communication system of any preceding example, wherein the data hub includes a sense resistor electrically connected in the power circuit in series with the light strip; a current sensing circuit electrically connected in parallel with the light strip and the sense resistor and having at least one output terminal, wherein the data hub output is accessible via the output terminal.

Example 29

The communication system of any preceding example, wherein the data hub includes a control circuit programmed and configured to derive the data hub output from the trailer component data.

Example 30

The communication system of any preceding example, wherein the sensor node is operable to encode the status information as trailer component data, and wherein the control circuit is operable to decode the trailer component data and to include the status information in the data hub output from the trailer component data.

Example 31

The communication system of any preceding example, wherein the sensor node is arranged and configured to broadcast the trailer component data as a time varying signal, and wherein the data hub output matches the time varying signal.

Example 32

The communication system of any preceding example, wherein the lamps of the light strip include one or more LEDs.

Example 33

The communication system of any preceding example, wherein the trailer component includes one or more LEDs.

Example 34

The communication system of any preceding example, wherein the trailer component is any one of a vehicle stop-tail-turn lamp, a vehicle turn signal lamp, a vehicle brake lamp, a vehicle tail lamp, a vehicle running lamp, a vehicle anti-lock brake, a vehicle interior illumination lamp, or a vehicle reverse lamp.

Example 35

The communication system of any preceding example, wherein the trailer component is any one of an antilock brake system controller, a pressure sensor, a temperature sensor, a door sensor, a cargo sensor, a cargo a length sensor, a liquid level sensor, or a refrigerant level sensor.

Example 36

The communication system of any preceding example, wherein the light strip is mounted to a truck trailer coupled to a truck tractor that includes at least one trailer monitoring user interface, and wherein the trailer monitoring user interface is responsive to the data hub and is configured to provide information about the trailer component in response to the data hub output.

Example 37

The communication system of any preceding example, wherein the data hub output is electrically connected to the trailer monitoring user interface by a cable.

Example 38

The communication system of any preceding example, wherein the data hub is mounted in a common housing with the trailer monitoring user interface.

Example 39

The communication system of any preceding example, wherein the sensor node and data hub are mounted to the trailer.

Example 40

The communication system of any preceding example, wherein the sensor node is mounted to the trailer and the data hub is mounted to the truck.

Example 41

The communication system of any preceding example including a communication module configured to maintain a communication link with a remote trailer monitoring system, wherein the communication module is electrically connected to the data hub output, and wherein the communication module is configured to relay the data hub output to the remote trailer monitoring system.

Glossary of Definitions and Alternatives

While examples of the inventions are illustrated in the drawings and described herein, this disclosure is to be considered as illustrative and not restrictive in character. The present disclosure is exemplary in nature and all changes, equivalents, and modifications that come within the spirit of the invention are included. The detailed description is included herein to discuss aspects of the examples illustrated in the drawings for the purpose of promoting an understanding of the principles of the inventions. No limitation of the scope of the inventions is thereby intended. Any alterations and further modifications in the described examples, and any further applications of the principles described herein are contemplated as would normally occur to one skilled in the art to which the inventions relate. Some examples are disclosed in detail, however some features that may not be relevant may have been left out for the sake of clarity.

Where there are references to publications, patents, and patent applications cited herein, they are understood to be incorporated by reference as if each individual publication, patent, or patent application were specifically and individually indicated to be incorporated by reference and set forth in its entirety herein.

Singular forms "a", "an", "the", and the like include plural referents unless expressly discussed otherwise. As an illustration, references to "a device" or "the device" include one or more of such devices and equivalents thereof.

Directional terms, such as "up", "down", "top" "bottom", "fore", "aft", "lateral", "longitudinal", "radial", "circumferential", etc., are used herein solely for the convenience of the reader in order to aid in the reader's understanding of the illustrated examples. The use of these directional terms does not in any manner limit the described, illustrated, and/or claimed features to a specific direction and/or orientation.

Multiple related items illustrated in the drawings with the same part number which are differentiated by a letter for separate individual instances, may be referred to generally by a distinguishable portion of the full name, and/or by the number alone. For example, if multiple "laterally extending elements" 90A, 90B, 90C, and 90D are illustrated in the drawings, the disclosure may refer to these as "laterally extending elements 90A-90D," or as "laterally extending elements 90," or by a distinguishable portion of the full name such as "elements 90".

The language used in the disclosure are presumed to have only their plain and ordinary meaning, except as explicitly defined below. The words used in the definitions included herein are to only have their plain and ordinary meaning. Such plain and ordinary meaning is inclusive of all consistent dictionary definitions from the most recently published Webster's and Random House dictionaries. As used herein, the following definitions apply to the following terms or to common variations thereof (e.g., singular/plural forms, past/present tenses, etc.):

"About" with reference to numerical values generally refers to plus or minus 10% of the stated value. For example, if the stated value is 4.375, then use of the term "about 4.375" generally means a range between 3.9375 and 4.8125.

"Activate" generally is synonymous with "providing power to", or refers to "enabling a specific function" of a circuit or electronic device that already has power.

"And/or" is inclusive here, meaning "and" as well as "or". For example, "P and/or Q" encompasses, P, Q, and P with Q; and, such "P and/or Q" may include other elements as well.

"Anti-lock Braking System" generally refers to a vehicle safety system that allows the wheels on a motor vehicle (including trailers) to maintain tractive contact with the road surface according to driver inputs while braking, preventing the wheels from locking up (ceasing rotation) and avoiding uncontrolled skidding. ABS systems automatically apply the principles of threshold braking and cadence braking albeit a much faster rate and with better control than drivers can typically manage manually. ABS systems include wheel speed sensors to detect reduced wheel rotation indicative of impending wheel lock. An ABS controller is also included that can automatically actuate the braking system to reduce braking force on the affected wheel or wheels, and to quickly reapply braking force when the danger of wheel lock is reduced. This overall feedback loop may be executed multiple times a second resulting in rapid activation and deactivation of braking force or "pulsing" of the brakes.

Maximum braking force is obtained with approximately 10-20% slippage between the braked wheel's rotational speed and the road surface. Beyond this point, rolling grip diminishes rapidly and sliding friction provides a greater proportion of the force that slows the vehicle. Due to local heating and melting of the tires, the sliding friction can be very low. When braking at, or beyond, the peak braking force, steering input is largely ineffective since the grip of the tire is entirely consumed in braking the vehicle.

Threshold braking seeks to obtain peak friction by maintaining the maximum braking force possible without allowing wheels to slip excessively. Braking beyond the slipping point causes tires to slide and the frictional adhesion between the tire and driving surface is thus reduced. The aim of threshold braking is to keep the amount of tire slip at the optimal amount, the value that produces the maximum frictional, and thus braking force. When wheels are slipping significantly (kinetic friction), the amount of friction available for braking is typically substantially less than when the wheels are not slipping (static friction), thereby reducing the braking force. Peak friction occurs between the static and dynamic endpoints, and this is the point that threshold braking tries to maintain.

"Cadence" braking or "stutter" braking involves pumping the brake pedal and is used to allow a car to both steer and brake on a slippery surface. ABS systems generally provide this behavior automatically and at a much higher rate than most drivers can manually produce. It is used to effect an emergency stop where traction is limited to reduce the effect of skidding from road wheels locking up under braking. This can be a particular problem when different tires have different traction, such as on patchy ice for example. Cadence braking maximizes the time for the driver to steer around the obstacle ahead, as it allows the driver to steer while slowing.

ABS generally offers improved vehicle control and decreases stopping distances on dry and slippery surfaces; however, on loose gravel or snow-covered surfaces, ABS can significantly increase braking distance, although still improving vehicle steering control.

"Brake Lamp" generally refers to a lamp (usually red) attached to the rear of a vehicle that illuminates when the brakes are applied to serve as a warning to fellow drivers. As used herein, the term "brake lamp" includes stop lamps as that term is defined under the present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108.

"Cable" generally refers to one or more elongate strands of material that may be used to carry electromagnetic or electrical energy. A metallic or other electrically conductive material may be used to carry electric current. In another example, strands of glass, acrylic, or other substantially transparent material may be included in a cable for carrying light such as in a fiber-optic cable. A cable may include connectors at each end of the elongate strands for connecting to other cables to provide additional length. A cable is generally synonymous with a node in an electrical circuit and provides connectivity between elements in a circuit but does not include circuit elements. Any voltage drop across a cable is therefore a function of the overall resistance of the material used.

A cable may include a sheath or layer surrounding the cable with electrically non-conductive material to electrically insulate the cable from inadvertently electrically connecting with other conductive material adjacent the cable.

A cable may include multiple individual component cables, wires, or strands, each with, or without, a non-conductive sheathing. A cable may also include a non-conductive sheath or layer around the conductive material, as well as one or more layers of conductive shielding material around the non-conductive sheath to capture stray electromagnetic energy that may be transmitted by electromagnet signals traveling along the conductive material of the cable, and to insulate the cable from stray electromagnetic energy that may be present in the environment the cable is passing through. Examples of cables include twisted pair cable, coaxial cable, "twin-lead", fiber-optic cable, hybrid optical and electrical cable, ribbon cables with multiple side-by-side wires, and the like.

"Cargo Sensor" generally refers to a sensors configured to determine whether a vehicle is loaded or unloaded, to what extent a vehicle is loaded, and optionally the position of different portions of the load inside the vehicle. Any suitable sensing technology may be used for this purpose. Examples include cargo sensors that use ultrasonic detection, optical image analysis of the cargo area, or laser time-of-flight measurements for detecting the presence of cargo within a cargo area.

"Computer" generally refers to any computing device configured to compute a result from any number of input values or variables. A computer may include a processor for performing calculations to process input or output. A computer may include a memory for storing values to be processed by the processor, or for storing the results of previous processing.

A computer may also be configured to accept input and output from a wide array of input and output devices for receiving or sending values. Such devices include other computers, keyboards, mice, visual displays, printers, industrial equipment, and systems or machinery of all types and sizes. For example, a computer can control a network or network interface to perform various network communications upon request. The network interface may be part of the computer, or characterized as separate and remote from the computer.

A computer may be a single, physical, computing device such as a desktop computer, a laptop computer, or may be composed of multiple devices of the same type such as a group of servers operating as one device in a networked cluster, or a heterogeneous combination of different computing devices operating as one computer and linked together by a communication network. The communication network connected to the computer may also be connected to a wider network such as the internet. Thus a computer may include one or more physical processors or other computing devices or circuitry, and may also include any suitable type of memory.

A computer may also be a virtual computing platform having an unknown or fluctuating number of physical processors and memories or memory devices. A computer may thus be physically located in one geographical location or physically spread across several widely scattered locations with multiple processors linked together by a communication network to operate as a single computer.

The concept of "computer" and "processor" within a computer or computing device also encompasses any such processor or computing device serving to make calculations or comparisons as part of the disclosed system. Processing operations related to threshold comparisons, rules comparisons, calculations, and the like occurring in a computer may occur, for example, on separate servers, the same server with separate processors, or on a virtual computing environment having an unknown number of physical processors as described above.

A computer may be optionally coupled to one or more visual displays and/or may include an integrated visual display. Likewise, displays may be of the same type, or a heterogeneous combination of different visual devices. A computer may also include one or more operator input devices such as a keyboard, mouse, touch screen, laser or infrared pointing device, or gyroscopic pointing device to name just a few representative examples. Also, besides a display, one or more other output devices may be included such as a printer, plotter, industrial manufacturing machine, 3D printer, and the like. As such, various display, input and output device arrangements are possible.

Multiple computers or computing devices may be configured to communicate with one another or with other devices over wired or wireless communication links to form a network. Network communications may pass through various computers operating as network appliances such as switches, routers, firewalls or other network devices or interfaces before passing over other larger computer networks such as the internet. Communications can also be passed over the network as wireless data transmissions carried over electromagnetic waves through transmission lines or free space. Such communications include using WiFi or other Wireless Local Area Network (WLAN) or a cellular transmitter/receiver to transfer data.

"Communication System" generally refers to an arrangement of cooperating devices or systems configured to communicate with each other. The communication system may use electric or non-electric sources such as graphic images, electromagnetic radiation, the human voice, digital or analog data, and the like, and may carry information provided by these sources as electric or nonelectric signals.

A communication system may include input transducers or sensors to capture input from the sources. Such sensors may include microphones, cameras, keyboards, motion sensors, light sensors, or other such transducers for capturing some aspect from one location or environment and converting or capturing it as input. A transmitter may be included to convert captured information from the input sources into electric signals and may include aspects such as noise filters, analog-to-digital converters, encoders, modulators, signal amplifiers, and the like to prepare the captured input for transmission. Transmission may be achieved by an antenna, or any suitable device for converting the input to electromagnetic energy in any suitable form.

A receiver may be included to accept signals from a transmitter via a receiving antenna, the receiver may be configured to capture and reconstruct the signal as it was before transmission. The receiver may include components such as noise filters, digital to analog converters, decoders, demodulators, signal amplifiers, and the like. An output transducer may be included that is coupled to the receiver in any suitable way and is configured to convert the signals from a receiver to a different form such as the original form the information was in before it was transmitted. Such output transducers may include speakers for audio output, monitors displaying visual output, motors or actuators for translating the transmitted signal into movement or motion, lights, or other devices responsive to a signal output by the receiver.

"Communications cable" generally refers to a cable configured to carry digital or analog signals.

"Communication Link" generally refers to a connection between two or more communicating entities and may or may not include a communications channel between the communicating entities. The communication between the communicating entities may occur by any suitable means. For example, the connection may be implemented as a physical link, an electrical link, an electromagnetic link, a logical link, or any other suitable linkage facilitating communication.

In the case of a physical link, communication may occur by multiple components in the communication link configured to respond to one another by physical movement of one element in relation to another. In the case of an electrical link, the communication link may be composed of multiple electrical conductors electrically connected to form the communication link.

In the case of an electromagnetic link, the connection may be implemented by sending or receiving electromagnetic energy at any suitable frequency, thus allowing communications to pass as electromagnetic waves. These electromagnetic waves may or may not pass through a physical medium such as an optical fiber, or through free space via one or more sending and receiving antennas, or any combination thereof. Electromagnetic waves may be passed at any suitable frequency including any frequency in the electromagnetic spectrum.

A communication link may include any suitable combination of hardware which may include software components as well. Such hardware may include routers, switches, networking endpoints, repeaters, signal strength enters, hubs, and the like.

In the case of a logical link, the communication link may be a conceptual linkage between the sender and recipient such as a transmission station in the receiving station. Logical link may include any combination of physical, electrical, electromagnetic, or other types of communication links.

"Controller" generally refers to a mechanical or electronic device configured to control the behavior of another mechanical or electronic device. A controller may include a "control circuit" configured to provide signals or other electrical impulses that may be received and interpreted by the controlled device to indicate how it should behave.

"Current" generally refers to the rate of flow of electric charge past a point or region. An electric current is said to exist when there is a net flow of electric charge through a region. When an electric current flows in a suitably shaped conductor at radio frequencies, radio waves can be generated. These travel at about the speed of light and can cause electric currents in distant conductors. Electric currents cause Joule heating, and may be useful for creating magnetic fields.

"Data" generally refers to one or more values of qualitative or quantitative variables that are usually the result of measurements. Data may be considered "atomic" as being finite individual units of specific information. Data can also be thought of as a value or set of values that includes a frame of reference indicating some meaning associated with the values. For example, the number "2" alone is a symbol that absent some context is meaningless. The number "2" may be considered "data" when it is understood to indicate, for example, the number of items produced in an hour.

Data may be organized and represented in a structured format. Examples include a tabular representation using rows and columns, a tree representation with a set of nodes considered to have a parent-children relationship, or a graph representation as a set of connected nodes to name a few.

The term "data" can refer to unprocessed data or "raw data" such as a collection of numbers, characters, or other symbols representing individual facts or opinions. Data may be collected by sensors in controlled or uncontrolled environments, or generated by observation, recording, or by processing of other data. The word "data" may be used in a plural or singular form. The older plural form "datum" may be used as well.

"Diode" generally refers to a two terminal electrical device which allows current to flow in one direction, but prevents current from flowing in the opposite direction. Examples include p-n silicon junction diodes, light emitting diodes, Schottky diodes, and Zener diodes, to name a few.

"Electrically connected" generally refers to a configuration of two objects that allows electricity to flow between them or through them. In one example, two conductive materials are physically adjacent one another and are sufficiently close together so that electricity can pass between them. In another example, two conductive materials are in physical contact allowing electricity to flow between them.

"Ground" or "circuit ground" generally refers to a node in an electrical circuit that is designated as a reference node for other nodes in a circuit. It is a reference point in an electrical circuit from which voltages are measured, a common return path for electric current, and/or a direct physical connection to the Earth.

"Ground cable" generally refers to a cable electrically connecting to a circuit ground.

"Interior illumination lamp" generally refers to a lamp located in the interior of a vehicle or trailer.

"Lamp" generally refers to an electrical device configured to produce light using electrical power. The generated light may be in the visible range, ultraviolet, infrared, or other light. Example illumination technologies that may be employed in a lamp include, but are not limited to, incandescent, halogen, LED, fluorescent, carbon arc, xenon arc, metal-halide, mercury-vapor, sulfur, neon, sodium-vapor, or others.

"Light Emitting Diode" or "LED" generally refers to a diode that is configured to emit light when electrical power passes through it. The term may be used to refer to single diodes as well as arrays of LED's and/or grouped light emitting diodes. This can include the die and/or the LED film or other laminate, LED packages, said packages may include encapsulating material around a die, and the material, typically transparent, may or may not have color tinting and/or may or may not have a colored sub-cover. An LED can be a variety of colors, shapes, sizes and designs, including with or without heat sinking, lenses, or reflectors, built into the package.

"Light Sensor" or "photoelectric device" or "photo sensor" generally refers to a device that converts electromagnetic energy in the form of light (e.g. photons) into electricity or electrical signals (e.g. electrons). A light sensor may be responsive to electromagnetic energy in a range of frequencies from "Infra-red" to "Visible" up to and including the "Ultraviolet" light spectrum. Examples include, but are not limited to:

Photo-emissive Cells: Devices which release free electrons from a light sensitive material such as caesium when struck by a photon of sufficient energy. The amount of energy the photons have depends on the frequency of the light and the higher the frequency, the more energy the photons have converting light energy into electrical energy Photo-conductive Cells: Devices which vary their electrical resistance when subjected to light. Photoconductivity results from light hitting a semiconductor material which controls the current flow through it. Thus, more light increase the current for a given applied voltage. Examples include Cadmium Sulfide LDR photocells.

Photo-voltaic Cells: Often referred to colloquially as "solar cells," these are devices whose electrical characteristics, such as current, voltage, or resistance, vary when exposed to light. Light energy falls on a semiconductor material causing electrons to be excited out of their normal orbits where they may be captured by an electrode.

Photo-junction Devices: These photodevices are mainly true semiconductor devices such as the photodiode or phototransistor which use light to control the flow of electrons and holes across their PN-junction. Photo-junction devices are commonly designed for detector application and light penetration with their spectral response tuned to the wavelength of incident light.

"Liquid Level Sensor" generally refers to a sensor configured to measure the depth of liquid in a container. Examples include an optical level switch that includes an LED and a phototransistor, a capacitance level sensor, an ultrasonic sensor, electromagnetic sensors using microwaves, RADAR, and the like, vibrational sensors, conductive sensors, or float switches.

"LED Lamp" generally refers to an electrical device that uses Light Emitting Diodes (LEDs) to produce light using electrical power. A lamp may include a single LED, or multiple LEDs.

"LED fault signal" generally refers to a signal that is used to indicate the failure of an LED. The LED fault signal can take the form of power to illuminate a fault LED, a data message (such as via a serial communication protocol or other), a mechanical indicator, or other. The LED fault signal can be used to communicate a failed LED to an onboard computer or display system such as may be found in the cabin of a vehicle or a trailer.

"Memory" generally refers to any storage system or device configured to retain data or information. Each memory may include one or more types of solid-sate electronic memory, magnetic memory, or optical memory, just to name a few. Memory may use any suitable storage technology, or combination of storage technologies, and may be volatile, nonvolatile, or a hybrid combination of volatile and nonvolatile varieties. By way of non-limiting example, each memory may include solid-sate electronic Random Access Memory (RAM), Sequentially Accessible Memory (SAM) (such as the First-In, First-Out (FIFO) variety or the Last-In-First-Out (LIFO) variety), Programmable Read Only Memory (PROM), Electronically Programmable Read Only Memory (EPROM), or Electrically Erasable Programmable Read Only Memory (EEPROM).

Memory can refer to Dynamic Random Access Memory (DRAM) or any variants, including static random access memory (SRAM), Burst SRAM or Synch Burst SRAM (BSRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (REDO DRAM), Single Data Rate Synchronous DRAM (SDR SDRAM), Double Data Rate SDRAM (DDR SDRAM), Direct Rambus DRAM (DRDRAM), or Extreme Data Rate DRAM (XDR DRAM).

Memory can also refer to non-volatile storage technologies such as non-volatile read access memory (NVRAM), flash memory, non-volatile static RAM (nvSRAM), Ferroelectric RAM (FeRAM), Magnetoresistive RAM (MRAM), Phase-change memory (PRAM), conductive-bridging RAM (CBRAM), Silicon-Oxide-Nitride-Oxide-Silicon (SONOS), Resistive RAM (RRAM), Domain Wall Memory (DWM) or "Racetrack" memory, Nano-RAM (NRAM), or Millipede memory. Other non-volatile types of memory include optical disc memory (such as a DVD or CD ROM), a magnetically encoded hard disc or hard disc platter, floppy disc, tape, or cartridge media. The concept of a "memory" includes the use of any suitable storage technology or any combination of storage technologies.

"Microcontroller" or "MCU" generally refers to a small computer on a single integrated circuit. It may be similar to, but less sophisticated than, a System on a Chip or "SoC"; an SoC may include a microcontroller as one of its components. A microcontroller may contain one or more CPUs (processor cores) along with memory and programmable input/output peripherals. Program memory in the form of ferroelectric RAM, NOR flash or OTP ROM may also be included on the chip, as well as a small amount of RAM. Microcontrollers may be designed for embedded applications, in contrast to the microprocessors used in personal computers or other general purpose applications consisting of various discrete chips.

Microcontrollers may be included in automatically controlled products and devices, such as automobile engine control systems, implantable medical devices, remote controls, office machines, appliances, power tools, toys and other embedded systems. An MCU may be configured to handle mixed signals thus integrating analog components needed to control non-digital electronic systems.

Some microcontrollers may use four-bit words and operate at frequencies as low as 4 kHz, for low power consumption (single-digit milliwatts or microwatts). They will generally have the ability to retain functionality while waiting for an event such as a button press or other interrupt; power consumption while sleeping (CPU clock and most peripherals off) may be just nanowatts, making many of them well suited for long lasting battery applications. Other microcontrollers may serve performance roles, where they may need to act more like a Digital Signal Processor (DSP), with higher clock speeds and power consumption. A microcontroller may include any suitable combination of circuits such as:

1. a central processing unit-ranging from small and simple processors with registers as small as 4 bits or list, to complex processors with registers that are 32, 64, or more bits
2. volatile memory (RAM) for data storage
3. ROM, EPROM, EEPROM or Flash memory for program and operating parameter storage
4. discrete input and output bits, allowing control or detection of the logic sate of an individual package pin
5. serial input/output such as serial ports (UARTs)
6. other serial communications interfaces like I²C, Serial Peripheral Interface and Controller Area Network for system interconnect
7. peripherals such as timers, event counters, PWM generators, and watchdog
8. clock generator-often an oscillator for a quartz timing crystal, resonator or RC circuit
9. many include analog-to-digital converters, some include digital-to-analog converters
10 in-circuit programming and in-circuit debugging support "Multiple" as used herein is synonymous with the term "plurality" and refers to more than one, or by extension, two or more.

"Network" or "Computer Network" generally refers to a telecommunications network that allows computers to exchange data. Computers can pass data to each other along data connections by transforming data into a collection of datagrams or packets. The connections between computers and the network may be established using either cables, optical fibers, or via electromagnetic transmissions such as for wireless network devices.

Computers coupled to a network may be referred to as "nodes" or as "hosts" and may originate, broadcast, route, or accept data from the network. Nodes can include any computing device such as personal computers, phones, servers as well as specialized computers that operate to maintain the flow of data across the network, referred to as "network devices". Two nodes can be considered "networked together" when one device is able to exchange information with another device, whether or not they have a direct connection to each other.

Examples of wired network connections may include Digital Subscriber Lines (DSL), coaxial cable lines, or optical fiber lines. The wireless connections may include BLUETOOTH, Worldwide Interoperability for Microwave Access (WiMAX), infrared channel or satellite band, or any wireless local area network (Wi-Fi) such as those implemented using the Institute of Electrical and Electronics Engineers' (IEEE) 802.11 standards (e.g. 802.11 (a), 802.11 (b), 802.11 (g), or 802.11 (n) to name a few). Wireless links may also include or use any cellular network standards used to communicate among mobile devices including 1G, 2G, 3G, or 4G. The network standards may qualify as 1G, 2G, etc. by fulfilling a specification or standards such as the specifications maintained by International Telecommunication Union (ITU). For example, a network may be referred to as a "3G network" if it meets the criteria in the International Mobile Telecommunications-2000 (IMT-2000) specification regardless of what it may otherwise be referred to. A network may be referred to as a "4G network" if it meets the requirements of the International Mobile Telecommunications Advanced (IMTAdvanced) specification. Examples of cellular network or other wireless standards include AMPS, GSM, GPRS, UMTS, LTE, LTE Advanced, Mobile WiMAX, and WiMAX-Advanced.

Cellular network standards may use various channel access methods such as FDMA, TDMA, CDMA, or SDMA. Different types of data may be transmitted via different links and standards, or the same types of data may be transmitted via different links and standards.

The geographical scope of the network may vary widely. Examples include a body area network (BAN), a personal area network (PAN), a low power wireless Personal Area Network using IPv6 (6LoWPAN), a local-area network (LAN), a metropolitan area network (MAN), a wide area network (WAN), or the Internet.

A network may have any suitable network topology defining the number and use of the network connections. The network topology may be of any suitable form and may include point-to-point, bus, star, ring, mesh, or tree. A network may be an overlay network which is virtual and is configured as one or more layers that use or "lay on top of" other networks.

A network may utilize different communication protocols or messaging techniques including layers or stacks of protocols. Examples include the Ethernet protocol, the internet protocol suite (TCP/IP), the ATM (Asynchronous Transfer Mode) technique, the SONET (Synchronous Optical Networking) protocol, or the SDE1 (Synchronous Digital Elierarchy) protocol. The TCP/IP internet protocol suite may include application layer, transport layer, internet layer (including, e.g., IPv6), or the link layer.

"Node" as used herein encompasses multiple concepts depending on the context:

As used in the sense of an electrical connection, a "node" generally refers to an electrical junction between two or more electrical components, wherein the voltage at all physical points within the node is substantially equal.

As used in a network or computer sense, a "node" generally refers to a connection point, a redistribution point, or a communication endpoint. The concept includes devices or data points on a large computer network, including devices such a PC, phone, or printer, or other devices such as a sensor, controller, machine, or indicator. In this context, a node may have a programmed or engineered capability that enables it to recognize, process, or forward transmissions to other nodes.

"Optionally" as used herein means discretionary; not required; possible, but not compulsory; left to personal choice.

"Parallel" generally refers to an electrical connection of two or more components where the voltage across the input and output terminals of the components is equal.

"Portion" means a part of a whole, either separated from or integrated with it.

"Power Cable" generally refers to a cable configured to transfer electrical power as part of an electrical circuit. A power cable may be used exclusively to transfer power, or it may be used to also transfer signals, such as in the case of a Power Line Communication (PLC) system.

"Predominately" as used herein is synonymous with greater than 50%.

"Processor" generally refers to one or more electronic components configured to operate as a single unit configured or programmed to process input to generate an output. Alternatively, when of a multi-component form, a processor may have one or more components located remotely relative to the others. One or more components of each processor may be of the electronic variety defining digital circuitry, analog circuitry, or both. In one example, each processor is of a conventional, integrated circuit microprocessor arrangement, such as one or more PENTIUM, i3, i5 or i7 processors supplied by INTEL Corporation of Santa Clara, California, USA. Other examples of commercially available processors include but are not limited to the X8 and Freescale Coldfire processors made by Motorola Corporation of Schaumburg, Illinois, USA; the ARM processor and TEGRA System on a Chip (SoC) processors manufactured by Nvidia of Santa Clara, California, USA; the POWER7 processor manufactured by International Business Machines of White Plains, New York, USA; any of the FX, Phenom, Athlon, Sempron, or Opteron processors manufactured by Advanced Micro Devices of in Sunnyvale, California, USA; or the Snapdragon SoC processors manufactured by Qalcomm of San Diego, California, USA.

A processor also includes Application-Specific Integrated Circuit (ASIC). An ASIC is an Integrated Circuit (IC) customized to perform a specific series of logical operations is controlling a computer to perform specific tasks or functions. An ASIC is an example of a processor for a special purpose computer, rather than a processor configured for general-purpose use. An application-specific integrated circuit generally is not reprogrammable to perform other functions and may be programmed once when it is manufactured.

In another example, a processor may be of the "field programmable" type. Such processors may be programmed multiple times "in the field" to perform various specialized or general functions after they are manufactured. A field-programmable processor may include a Field-Programmable Gate Array (FPGA) in an integrated circuit in the processor. FPGA may be programmed to perform a specific series of instructions which may be retained in nonvolatile memory cells in the FPGA. The FPGA may be configured by a customer or a designer using a hardware description language (HDL). In FPGA may be reprogrammed using another computer to reconfigure the FPGA to implement a new set of commands or operating instructions. Such an operation may be executed in any suitable means such as by a firmware upgrade to the processor circuitry.

Just as the concept of a computer is not limited to a single physical device in a single location, so also the concept of a "processor" is not limited to a single physical logic circuit or package of circuits but includes one or more such circuits or circuit packages possibly contained within or across multiple computers in numerous physical locations. In a virtual computing environment, an unknown number of physical processors may be actively processing data, the unknown number may automatically change over time as well.

The concept of a "processor" includes a device configured or programmed to make threshold comparisons, rules comparisons, calculations, or perform logical operations applying a rule to data yielding a logical result (e.g. "true" or "false"). Processing activities may occur in multiple single processors on separate servers, on multiple processors in a single server with separate processors, or on multiple processors physically remote from one another in separate computing devices.

"Resistor" generally refers to a device having a resistance to the passage of electrical current.

"Sensor" generally refers to a transducer configured to sense or detect a characteristic of the environment local to the sensor. For example, sensors may be constructed to detect events or changes in quantities or sensed parameters providing a corresponding output, generally as an electrical or electromagnetic signal. A sensor's sensitivity indicates how much the sensor's output changes when the input quantity being measured changes.

"Sense parameter" generally refers to a property of the environment detectable by a sensor. As used herein, sense parameter can be synonymous with an operating condition, environmental factor, sensor parameter, or environmental condition. Sense parameters may include temperature, air pressure, speed, acceleration, the presence or intensity of sound or light or other electromagnetic phenomenon, the strength and/or orientation of a magnetic or electrical field, and the like.

"Series" generally refers to an electrical connection of two or more components where current passes through the first component and into the second component, and where the current passing through the two components is the same "Signal" generally refers to a function or means of representing information. It may be thought of as the output of a transformation or encoding process. The concept generally includes a change in the state of a medium or carrier that conveys the information. The medium can be any suitable medium such as air, water, electricity, magnetism, or electromagnetic energy such as in the case of radio waves, pulses of visible or invisible light, and the like.

As used herein, a "signal" implies a representation of meaningful information. Arbitrary or random changes in the state of a carrier medium are generally not considered "signals" and may be considered "noise". For example, arbitrary binary data streams are not considered as signals. On the other hand, analog and digital signals that are representations of analog physical quantities are examples of signals. A signal is commonly not useful without some way to transmit or send the information, and a receiver responsive to the transmitter for receiving the information.

In a communication system, for example, a transmitter encodes a message to a signal, which is carried to a receiver by the communications channel. For example, the words "The time is 12 o'clock" might be the message spoken into a telephone. The telephone transmitter may then convert the sounds into an electrical voltage signal. The signal is transmitted to the receiving telephone by wires, at the receiver it is reconverted into sounds.

Signals may be thought of as "discrete" or "continuous." Discrete-time signals are often referred to as time series in other fields. Continuous-time signals are often referred to as continuous signals even when the signal functions are not continuous, such as in a square-wave signal.

Another categorization is signals which are "discrete-valued" and "continuous-valued". Particularly in digital signal processing a digital signal is sometimes defined as a sequence of discrete values, that may or may not be derived from an underlying continuous-valued physical process. In other contexts, digital signals are defined as the continuous-time waveform signals in a digital system, representing a bit-stream. In the first case, a signal that is generated by means of a digital modulation method may be considered as converted to an analog signal, while it may be considered as a digital signal in the second case.

"Socket" or "Receptacle" generally refers a device into which something fits in order to electrically and/or physically connect another electrical device to a circuit.

"Stop-tail-turn Lamp" or "STT Lamp" generally refers to a lamp which is compliant with present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108.

"Switching device" generally refers to a device that is capable of dynamically allowing or interrupting current flow. Examples of such devices include, but are not limited to, mechanical switches, relays or contactors, a Triode for Alternating Current (TRIAC) or other bidirectional triode thyristor, or any type of transistor such as a Bipolar Junction Transistor (BJT) including NPN or PNP transistors, or a Field Effect Transistor (FET) such as a Junction FET (JFET), or Metal Oxide Semiconductor FET (MOSFET) to name a few non-limiting examples.

"Terminal" generally refers to a plug, socket or other connection (male, female, mixed, hermaphroditic, or otherwise) for mechanically and electrically connecting two or more wires or other conductors.

"Trailer" generally refers to a vehicle that is configured to be moved about using some other vehicle coupled to the trailer.

"Truck" generally refers to a powered truck (also known as a tractor or cab) for pulling a trailer.

"Vehicle" generally refers to a self-propelled or towed device for transportation, including without limitation, car, truck, bus, boat, tank or other military vehicle, airplane, truck trailer, truck cab, boat trailer, other trailer, emergency vehicle, and motorcycle.

What is claimed is:

1. A communication system for a trailer, comprising:
   a light strip having one or more lamps arranged in an elongated string sharing common packaging, wherein the common packaging is independent of the trailer, and wherein the light strip includes a separate light strip power circuit and ground circuit in the packaging that is configured to provide power and ground to the one or more lamps of the light strip;
   a sensor node electrically connected to a trailer component, wherein the sensor node is electrically connected to the light strip via the light strip power and ground circuits, wherein the sensor node is configured to receive status information about the trailer component, and wherein the sensor node is configured to use the light strip power circuit or ground circuit as a shared data bus to carry trailer component data that corresponds to the status of the trailer component; and
   a data hub electrically connected to the light strip power and ground circuits, wherein the data hub is configured to capture the trailer component data from the sensor node via the light strip power or ground circuits and to provide corresponding data hub output;
   wherein the light strip power circuit is operable as a power circuit and a data bus to supply power to the one or more lamps of the light strip and to provide the data bus for carrying the trailer component data between the sensor node and the data hub.

2. The communication system of claim 1, comprising:
   a sensor electrically connected to the trailer component and the sensor node, wherein the sensor is responsive to the trailer component and is configured to generate the status information about the trailer component for the sensor node.

3. The communication system of claim 2, wherein the status information about the trailer component includes a fault indicator indicating whether or not the trailer component has failed.

4. The communication system of claim 2, the sensor comprising:
   a fault detection circuit arranged and configured to determine when the trailer component has failed.

5. The communication system of claim 2, wherein the status information includes a temperature indicator indicating a temperature reading obtained by the trailer component.

6. The communication system of claim 2, wherein the status information includes a door open indicator indicating whether or not a door of the trailer is open.

7. The communication system of claim 2, wherein the status information includes a pressure indicator indicating a pressure reading obtained by the trailer component.

8. The communication system of claim 2, wherein the status information includes a status code indicating an operational state of the trailer component.

9. The communication system of claim 2, wherein the status information includes operational parameter values indicating operating parameters of the trailer component.

10. The communication system of claim 3, wherein the sensor is separate and distinct from the sensor node.

11. The communication system of claim 3, wherein the sensor is mounted in a receptacle of the trailer component.

12. The communication system of claim 3, wherein the sensor is included with the sensor node.

13. The communication system of claim 1, wherein the sensor node comprises:
    a control circuit responsive to the trailer component input; and
    a switching device responsive to the control circuit, wherein the switching device is configured to selectively electrically connect and disconnect a shunt resistor to the power circuit in response to the control circuit.

14. The communication system of claim 13, wherein the current in the power circuit is increased when the shunt resistor is connected to power, and wherein the current in the power circuit is decreased when the shunt resistor is disconnected from the power circuit.

15. The communication system of claim 1, wherein the data hub is configured to measure changes in current flowing through the power circuit and to generate the data hub output accordingly.

16. The communication system of claim 15, wherein the data hub comprises:
    a control circuit responsive to changes in current passing through a sense resistor, wherein the sense resistor is electrically connected in series upstream in the power circuit from the light strip.

17. The communication system of claim 16, wherein the trailer component data is defined by time varying changes in current of the power circuit, the current varying between a first level and a second level higher than the first level.

18. The communication system of claim 1, wherein the light strip defines a minimum current level required to activate the one or more lamps of the light strip, and wherein the trailer component data is defined by a time varying change in current between a first level and a second level higher than the first level.

19. The communication system of claim 18, wherein the second level is less than the minimum current level.

20. The communication system of claim 18, wherein the first level is greater than the minimum current level.

21. The communication system of claim 20, wherein the light strip defines a maximum current level for the lamps of the light strip, and wherein the second level is less than the maximum level for the lamps.

22. The communication system of claim 18, wherein the first and second levels are less than the minimum current level.

23. The communication system of claim 22, wherein the first level is less than the minimum current level, and wherein the second level is greater than the minimum current level.

24. The communication system of claim 18, wherein the data signal defines a frequency of greater than 100 Hz.

25. The communication system of claim 18, wherein the data signal defines a frequency of greater than 10,000 Hz.

26. The communication system of claim 1, wherein the sensor node is electrically connected in parallel with the lamps of the light strip.

27. The communication system of claim 26, wherein the sensor node comprises:
    a switching device configured to selectively electrically connect and disconnect a shunt resistor to the power circuit in response to the information about the trailer component, wherein the switching device is electrically connected in series with a shunt resister, and wherein the combination of the switching device and the shunt resistor are electrically connected in parallel with the light strip.

28. The communication system of claim 26, wherein the data hub comprises: a sense resistor electrically connected in the power circuit in series with the light strip; and
    a current sensing circuit electrically connected in parallel with the light strip and the sense resistor and having at least one output terminal, wherein the data hub output is accessible via the output terminal.

29. The communication system of claim 1, wherein the data hub comprises:
    a control circuit programmed and configured to derive the data hub output from the trailer component data.

30. The communication system of claim 29, wherein the sensor node is operable to encode the status information as trailer component data, and wherein the control circuit is operable to decode the trailer component data and to include the status information in the data hub output from the trailer component data.

31. The communication system of claim 29, wherein the sensor node is arranged and configured to broadcast the trailer component data as a time varying signal, and wherein the data hub output matches the time varying signal.

32. The communication system of claim 1, wherein the lamps of the light strip include one or more LEDs.

33. The communication system of claim 1, wherein the trailer component includes one or more LEDs.

34. The communication system of claim 1, wherein the trailer component is any one of a vehicle stop-tail-turn lamp, a vehicle turn signal lamp, a vehicle brake lamp, a vehicle tail lamp, a vehicle running lamp, a vehicle anti-lock brake, a vehicle interior illumination lamp, or a vehicle reverse lamp.

35. The communication system of claim 1, wherein the trailer component is any one of an antilock brake system controller, a pressure sensor, a temperature sensor, a door sensor, a cargo sensor, a cargo a length sensor, a liquid level sensor, or a refrigerant level sensor.

36. The communication system of claim 1, wherein the light strip is mounted to a truck trailer coupled to a truck tractor that includes at least one trailer monitoring user interface, and wherein the trailer monitoring user interface is responsive to the data hub and is configured to provide information about the trailer component in response to the data hub output.

37. The communication system of claim 36, wherein the data hub output is electrically connected to the trailer monitoring user interface by a cable.

38. The communication system of claim 36, wherein the data hub is mounted in a common housing with the trailer monitoring user interface.

39. The communication system of claim 36, wherein the sensor node and data hub are mounted to the trailer.

40. The communication system of claim 36, wherein the sensor node is mounted to the trailer and the data hub is mounted to the truck.

41. The communication system of claim 1, comprising: a communication module configured to maintain a communication link with a remote trailer monitoring system, wherein the communication module is electrically connected to the data hub output, and wherein the communication module is configured to relay the data hub output to the remote trailer monitoring system.

* * * * *